United States Patent
Hariyama et al.

(10) Patent No.: US 10,258,982 B2
(45) Date of Patent: Apr. 16, 2019

(54) COMBINED-BLADE OPEN FLOW PATH DEVICE AND JOINED BODY THEREOF

(71) Applicant: JAPAN SCIENCE AND TECHNOLOGY AGENCY, Saitama (JP)

(72) Inventors: Takahiko Hariyama, Shizuoka (JP); Daisuke Ishii, Aichi (JP); Masatsugu Shimomura, Hokkaido (JP); Ko Okumura, Tokyo (JP); Marie Tani, Tokyo (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 147 days.

(21) Appl. No.: 15/305,467

(22) PCT Filed: Apr. 22, 2015

(86) PCT No.: PCT/JP2015/062233
§ 371 (c)(1),
(2) Date: Oct. 20, 2016

(87) PCT Pub. No.: WO2015/163365
PCT Pub. Date: Oct. 29, 2015

(65) Prior Publication Data
US 2017/0044002 A1 Feb. 16, 2017

(30) Foreign Application Priority Data

Apr. 23, 2014 (JP) ................ 2014-089650

(51) Int. Cl.
*B01L 3/00* (2006.01)
*F16K 99/00* (2006.01)
*B81B 1/00* (2006.01)

(52) U.S. Cl.
CPC ......... *B01L 3/5027* (2013.01); *B01L 3/50273* (2013.01); *B01L 3/502746* (2013.01);
(Continued)

(58) Field of Classification Search
CPC ..... B01L 2300/0838; B01L 2400/0406; B01L 2300/087; B01L 2300/0877; B01L 3/5027;
(Continued)

(56) References Cited

U.S. PATENT DOCUMENTS 6,451,264 B1 * 9/2002 Bhullar ............. B01L 3/502746
204/451
7,695,687 B2 * 4/2010 Delamarche ........ B01L 3/50273
204/451

(Continued)

FOREIGN PATENT DOCUMENTS

JP 2005-34827 2/2005
JP 2005-156500 6/2005

OTHER PUBLICATIONS

International Search Report dated Jul. 28, 2015 in corresponding International (PCT) Application No. PCT/JP2015/062233.
(Continued)

*Primary Examiner* — Atif Chaudry
(74) *Attorney, Agent, or Firm* — Wenderoth, Lind & Ponack, L.L.P.

(57) ABSTRACT

A combined-blade open flow path device is a fluid flow path device where flow paths are adjacent to each other. The combined-blade open flow path device comprises a substrate configured to constitute a bottom portion of the flow paths; and blades erected on a surface of the substrate, the blades being configured to constitute side walls of the flow paths, wherein the blades are erected in groups, each of the groups extending from an upstream side to a downstream side in a (Continued)

flow direction of a fluid with a space between each of the blades in the flow direction of the fluid in each of the groups for making conduction of the fluid between the adjacent flow paths possible, and wherein one end of one of the flow paths is configured to be in contact with the fluid and is configured to make a flow of the fluid possible.

9 Claims, 18 Drawing Sheets

(52) U.S. Cl.
CPC ............ *B81B 1/00* (2013.01); *F16K 99/0017* (2013.01); *F16K 99/0021* (2013.01); *B01L 2300/087* (2013.01); *B01L 2300/0816* (2013.01); *B01L 2300/0838* (2013.01); *B01L 2300/0858* (2013.01); *B01L 2300/0877* (2013.01); *B01L 2400/0406* (2013.01); *B01L 2400/086* (2013.01); *B81B 2201/058* (2013.01); *B81B 2203/0392* (2013.01); *Y10T 137/206* (2015.04); *Y10T 137/2224* (2015.04); *Y10T 137/85938* (2015.04)

(58) Field of Classification Search
CPC ........... Y10T 137/2224; Y10T 137/206; Y10T 137/85938; F16K 99/0017; F16K 99/0021
See application file for complete search history.

(56) References Cited

U.S. PATENT DOCUMENTS

| | | |
|---|---|---|
| 2004/0121449 A1 | 6/2004 | Pugia et al. |
| 2005/0265899 A1 | 12/2005 | Imamura et al. |
| 2006/0011480 A1 | 1/2006 | Sano et al. |
| 2009/0170062 A1* | 7/2009 | Schwind ............ B01L 3/50273 435/5 |
| 2014/0332098 A1* | 11/2014 | Juncker ............... B01L 3/50273 137/511 |

OTHER PUBLICATIONS

Daisuke Ishii et al., "Water transport mechanism through open capillaries analyzed by direct surface modifications on biological surfaces", Scientific Reports, Oct. 23, 2013.

Daisuke Ishii et al., "Aspiration-Free Micro Flow Path—Efficient Sucking with Fine Structure", The $22^{nd}$ Polymer Material Forum Press Conference, Nov. 15, 2013 (with English translation).

Marie Tani et al., "Capillary Rise on Legs of a Small Animal and on Artificially Textured Surfaces Mimicking Them", PLOS ONE, May 2014, vol. 9, Issue 5.

Marie Tani et al., "Towards combinatorial mixing devices without any pumps by open-capillary channels: fundamentals and applications", Scientific Reports, Jun. 23, 2015.

* cited by examiner (A)

(B)

US 10,258,982 B2

COMBINED-BLADE OPEN FLOW PATH DEVICE AND JOINED BODY THEREOF

TECHNICAL FIELD

The present invention relates to a combined-blade-type open flow path device and a joined body thereof.

BACKGROUND ART

Conventionally, a micro flow-path device for transporting fluid by using a tubular structure having a very small inner diameter and a micro space provided inside a small device as a flow path is known. As the application of such a micro flow-path device, for example, a medical catheter, a microfluidic device for analysis and reaction, or the like is exemplified. It is considered that by using the micro flow-path device, various effects such as miniaturization of a liquid feeding device, an analysis device, and a reaction device, tinier amount of an analysis sample and a reaction sample, and automation and energy conservation of a liquid feeding system, an analysis system, and a reaction system are obtainable.

However, in the conventional micro flow-path device, usually, high pressure is needed as an external energy during feeding the fluid into the flow path, the driving force cannot be secured in an environment where external energy cannot be obtained, and therefore the fluid transportation has been difficult. In addition, in the conventional micro flow-path device, the structure of the flow path is fine and elaborate, and therefore the problems that the flow path hindrance occurs due to the adhesion of impurities, and the cleaning efficiency is poor and the maintainability is low because of the closed flow path have been pointed out.

SUMMARY OF INVENTION

Technical Problem

By the way, the present inventors have conducted research for various properties of the nanostructure present on the body surface of an organism, and in particular, have discovered that a fine protrusion present on the leg of a wharf roach (Ligia exotica) living on the beach forms the open flow path with an excellent water transport mechanism. The present inventors have hit on an idea that according to this open flow path, an entirely new approach to the structure of the micro flow path conventionally studied mainly from the viewpoint of the microelectronics may be possible. Thus, the present inventors have eagerly advanced the research on the water transport mechanism by the micro protrusions of the legs of sea lice. Then, as the industrially available flow path device, the clues have been obtained by deepening of the study of measures for making feasible a new flow path device capable of controlling the flow rate of the fluid with using little external energy, furthermore, in the device of the micro structure, for making feasible the avoidance mechanism against the flow path hindering factors such as disturbance or partial damage of the flow path structure, and the deposit.

The present invention is made in view of the circumstances as described above, and has an object to provide a new open flow path device capable of reducing the use of external energy, capable of reducing the impact of the flow path hindrance due to the deposition of impurities in the micro structure, capable of easy cleaning, and capable of being applied to wide industrial fields.

Solution to Problem

The open flow path device of the present invention has the following characteristics to solve the above problems.

That is, the present invention is characterized by a combined-blade-type open flow path device being a fluid flow path device where a plurality of flow paths are adjacent to each other, the combined-blade-type open flow path device including: a substrate configured to constitute a bottom portion of the flow paths; and a plurality of blades erected on a surface of the substrate, the plurality of blades configured to constitute side walls of the flow paths, wherein the plurality of blades are erected in a plurality of numbers at a space in a direction from an upstream side to a downstream side of a flow of the fluid, and conduction of the fluid between the flow paths adjacent at the space is made possible, and wherein the flow of the fluid is made possible by one end of the flow path being in contact with the fluid.

In addition, the flow path device of the present invention is also characterized in that the flow of the fluid may be a flow in a horizontal direction where a gravity force is not involved, or a flow in a direction against a gravity force.

In addition, it is characterized in that the space of the blades in a direction from an upstream side to a downstream side of the flow of the fluid is preferably within a range from 0.1 μm to 100 μm as a micro flow-path device. More preferably, the space of the blades is within the range from 20 μm to 50 μm.

Furthermore, in addition, it is preferably characterized in that the plurality of the blades include a combined structure of first blades and second blades with a length in a direction from the upstream side to the downstream side of the flow of the fluid, the length being longer than a length of the first blades.

It is also preferred that the first blades are arranged in an outermost portion of the plurality of flow paths, and the second blades are provided in a central portion surrounded by the first blades.

In this case, it is preferred that a boundary portion where the first blades are arranged in the central portion at regular intervals is provided.

In addition, as the micro flow-path device, it is also preferred that the length of the first blades and the second blades in a direction from an upstream side to a downstream side of the flow of the fluid is within a range from 10 μm to 100 μm.

It is preferred that a forming method of the plurality of blades includes photolithography.

Then, in the combined-blade-type open flow path device of the present invention, it is preferred that hydrophilic or hydrophobic treatment is performed on a surface of the substrate and the blade.

In addition, with the above combined-blade-type open flow path device as a unit block, the present invention also provides a joined body of a plurality of the unit blocks as the combined-blade-type open flow path device joined body.

Advantageous Effects of Invention

According to the present invention, a new open flow path device capable of reducing the use of external energy, capable of reducing the impact of the flow path hindrance due to the deposition of impurities in the micro structure, capable of easy cleaning, and capable of being applied to wide industrial fields can be achieved.

BRIEF DESCRIPTION OF DRAWINGS

FIG. 14(A) shows the case where the blade arrangement is a simple pattern, and FIG. 14(B) shows the case where the blade arrangement is the combined patterns shown in FIG. 13.

DESCRIPTION OF EMBODIMENTS

Figure 1:
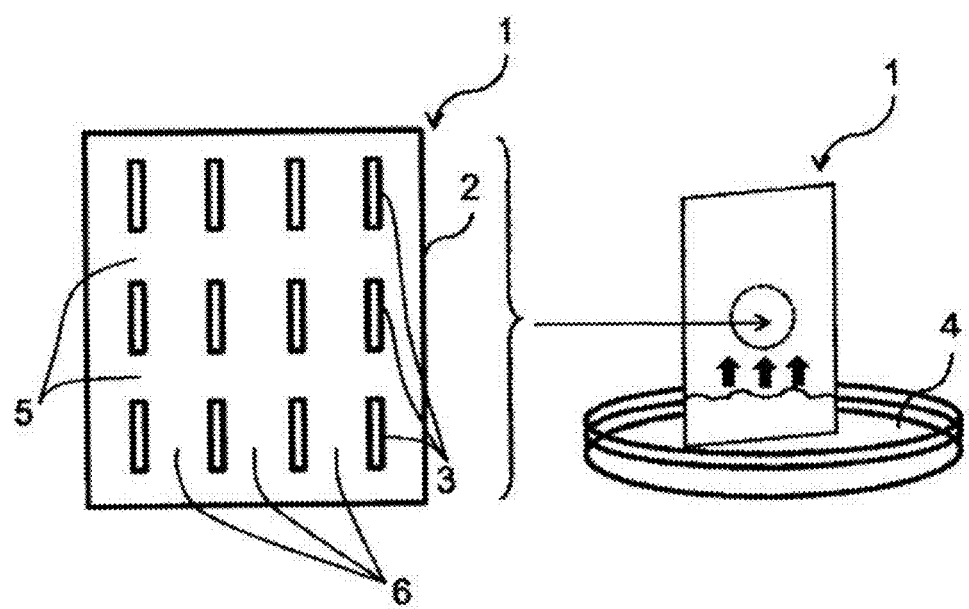
FIG. 1 is a front view showing a first embodiment of the combined-blade-type open flow path device of the present invention.

FIG. 1 is a front view showing a first embodiment of the combined-blade-type open flow path device of the present invention.

The combined-blade-type open flow path device 1 includes a plurality of blades 3 on the surface of the flat substrate 2. A plurality of blades 3 are erected with the space 5 apart in the direction from the upstream side to the downstream side of the flow of the fluid 4 on the surface of the substrate 2. In addition, in the lateral direction, a plurality of flow paths 6 are formed spaced apart from each other. The blade 3 constitutes the side wall of the flow path 6, and the substrate 2 forms the bottom part of the flow path 6.

In addition, as the overall picture is illustrated in FIG. 1, when one end of the flow path 6 is contacted with the fluid 4 in the state where the substrate 2 on which the blades 3 are erected is raised vertically or at a tilt, the fluid 4 ascends from the upstream side of the lower part of the flow path 6 to the downstream side of the upper part in the opposite direction of the gravity force with the surface tension or capillary force as the motive force. The fluid 4 is spontaneously transported. For this reason, the energy saving flow path without the need of pressurization at the start point of the flow of the flow path 6 can be achieved. Here, the substrate 2 may be have a flat shape, a curved surface shape, or a refractive surface shape. Then, in addition, depending on the arrangement position relative to the fluid 4 of the substrate 2 where one end of the flow path 6 is in contact with the fluid 4 and the attitude situation of the arrangement, the fluid 4 can be also transported obliquely upward and in the horizontal direction.

The fluid 4 is not limited to the low viscous liquid such as the water, and the liquid such as a viscous liquid such as an ionic liquid and oil, the gas, the gas-liquid mixed liquid, and the like are exemplified as the fluid 4. In addition, the fluid 4 may be a hydrophilic solvent or a hydrophobic solvent.

The fluid 4 is to be motivated by maintaining its viscous resistance, the surface tension of the fluid against the gravity force, and the fluid continuity of the capillary phenomenon. The type of the fluid 4, the width of the flow path 6, that is, the space of the blades 3 in the lateral direction, the wettability (hydrophilicity/hydrophobicity) of the surface of the blade 3 and the substrate 2, and the arrangement and the shape of the blade may be appropriately selected and set.

A plurality of blades 3 constituting the side walls of the flow path 6 are erected with the space 5 apart in the direction from the upstream side to the downstream side of the flow of the fluid 4, and the fluid 4 can be conducted between the adjacent flow paths 6. Even if there are flow path hindering factors such as the disturbance of the arrangement of the plurality of blades 3, the partial damage of the plurality of blades 3, and the adhesion of impurities, inclusion of this structure allows the fluid 4 to avoid them to be transported. In addition, the formation of the space 5 at any time on the blade 3 as the side wall of the flow path 6, and the change of the size of the space 5 and arrangement patterns of the blades 3 by the blades 3 being set as movable also allow the start point and end point of the flow path 6 to be freely set.

Figure 2:
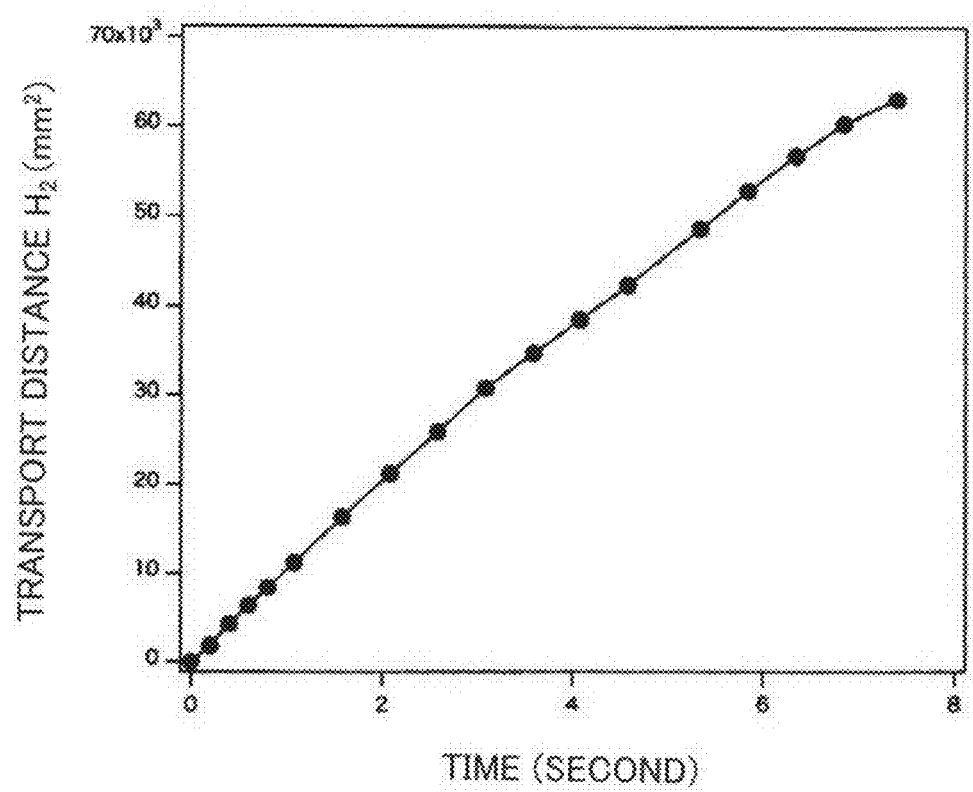
FIG. 2 is a graph illustrating the transport distance $H^2$ of the water against the gravity force (mm$^2$) in the case of transport of the water as the fluid by using the combined-blade-type open flow path device in FIG. 1.

FIG. 2 is a graph illustrating the indicator D of the ascending speed of the water against the gravity force as the gradient in the case of transport of the water as the fluid 4 by using the combined-blade-type open flow path device 1 in FIG. 1. It has been confirmed that the transport distance H shows the behavior according to the capillary theory that the transport distance H is proportional to the square root of the elapsed time T ($H^2=DT$). It should be noted that the fluid 4 is not limited to the low viscous liquid such as the water, and may be a viscous liquid such as an ionic liquid and oil.

The shape of the plurality of blades 3 is not particularly limited as long as the fluid 4 can be transported. For example, the plate shape of arc, the plate shape of rectangular cross-section, the plate shape of oval cross-section, and the like are exemplified.

In the case of the micro flow-path device, for example, the device having a width of the flow path of a scale of 5 μm to 100 μm, the plurality of blades 3 may be formed, for example, by photolithography.

The material of the substrate 2 and the plurality of blades 3 is not particularly limited as long as the surface patterning is easily performed on the material. For example, a high polymer material such as an epoxy-based resist material being the material of a semiconductor element, an inorganic material such as a the silicon substrate obtained by the etching treatment of the high polymer material as the resist, a gel material produced by the transfer method with the inorganic material as the mold, and the like are exemplified. For example, the epoxy-based resist material, the resist material being excellent in adhesion, a mask pattern with a high aspect ratio formable with the resist material, the resist material also used as the material of the microfluidic device being the conventional micro flow-path device, can also be suitably used for the combined-blade-type open flow path device 1 of the present invention.

It is preferred that the hydrophilic or hydrophobic treatment is performed on the surface of the substrate 2 and the blade 3 made of such a material. As the hydrophilic treatment, for example, the ultraviolet irradiation by the low-pressure mercury lamp (wavelength 253.7 nm, 184.9 nm), the excimer irradiation (wavelength 172 nm), the plasma surface modification, the corona treatment, and the like are exemplified. In particular, it is preferred that the hydrophilic functional group is formed on the surface of the substrate 2 by the ozone treatment generated by vacuum ultraviolet irradiation. In addition, as the hydrophobic treatment, the method of performing the surface modification by causing the functional monomer containing a hydrophobic group to graft-polymerize on the surface of the substrate, the method of causing the gold thin film to be formed by sputtering or the like to cause the functional thiol modifying agent to react, the method of causing the silane-coupling agent to react by hydrolysis after giving the hydrophilic treatment on the surface, and the like are exemplified.

By performance of the surface modification as described above, it is possible to reduce the contact angle between the surface of the substrate 2 and the blade 3 and the fluid 4, and to improve the wettability of the surface of the substrate 2 and the blade 3 in the combined-blade-type open flow path device 1 of the present invention. Thus, the method for performing the surface modification is selected depending on the type, composition, physical properties, and the like of the fluid 4, and the affinity between the surface of the substrate 2 and the blade 3 and the fluid 4 is enhanced, whereby the contact surface area with the fluid 4, for example, the water is increased, and therefore the driving force is increased, and accordingly the increase of the transport speed is achieved.

It should be noted that when the surface modification of the substrate 2 and the blade 3 is performed, the whole may be uniformly treated, or may be partially treated. For example, when the hydrophilic treatment is performed, the substrate 2 is partially covered with a photo mask and the like, and the above-described ultraviolet irradiation, excimer irradiation, and the like are performed, whereby the portion not covered by the photo mask and the like of the surface of the substrate 2 and the blade 3 can be selectively modified.

In addition, the surface of the substrate 2 and the blade 3 can be appropriately changed to be hydrophilic or hydrophobic depending on the type, the composition, and the physical properties of the fluid 4, and the application and the required performance, and the like of the combined-blade-type open flow path device 1. That is, the hydrophobic treatment may be performed on the surface on which the hydrophilic treatment has been performed, and the hydrophilic treatment may be performed on the surface on which the hydrophobic treatment has been performed.

As the space 5 in the direction from the upstream side to the downstream side of the flow of the fluid 4 of the plurality of blades 3, that is, space 5 between the blades 3, the range, for example, from 0.1 μm to 100 μm is exemplified in the micro flow-path device. Preferably, the range from 20 μm to 50 μm is exemplified. If the space 5 is within the above range, the transport speed of the fluid 4 equal to that of the conventional flow path without the space 5 apart can be obtained. In addition, the transport speed of the fluid 4 can be increased as the space 5 is narrower.

Figure 3:
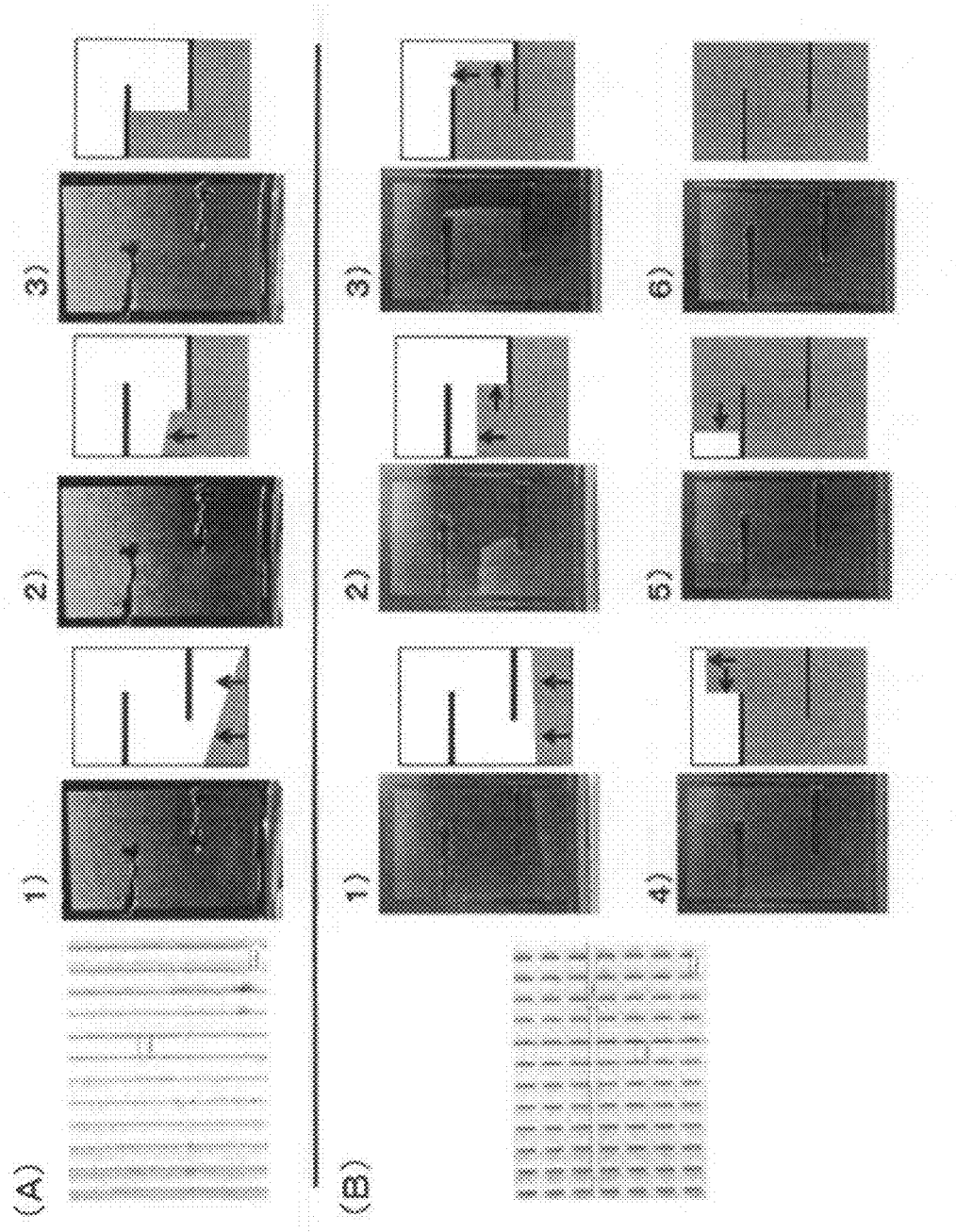
FIGS. 3(A) and 3(B) are photographs showing the avoidance of flow path hindering factors and schematic diagrams illustrating the movement of the fluid due to the spaces between the blades provided in the direction from the upstream side to the downstream side of the fluid flow in the combined-blade-type open flow path device in FIG. 1.

FIGS. 3(A) and 3(B) are pictures showing the avoidance of flow path hindering factors and schematic diagrams illustrating the movement of the fluid due to the spaces provided in the direction from the upstream side to the downstream side of the fluid flow in the combined-blade-type open flow path device 1 in FIG. 1. In the open flow path of independent stripe type where space 5 is not provided in the side wall of the flow path 6, as shown in FIG. 3(A), the flow path hindering factor installed in the flow path cannot be avoided, and the transport of the fluid 4 stops in the middle. On the other hand, in the combined-blade-type open flow path device 1 of the present invention, as shown in FIG. 3(B), it is the plurality of blades 3 that constitute the side wall of the flow path 6, and the space 5 is provided between the blades 3, and therefore the flow path hindering factor installed in the flow path can be avoided, and the fluid 4 can be transported to the upper end portion of the flow path 6.

As the length in the direction from the upstream side to the downstream side of the flow of the fluid 4 of the plurality of blades 3, that is, the length of the blade 3, the range, for example, from 10 μm to 100 μm is exemplified in the micro flow-path device. Preferably, the range from 25 μm to 50 μm is exemplified. The length of the blade 3 can be appropriately set in view of the width and the erected height of the blade 3 described below, the width of the flow path, and the like.

As the length of the plurality of blades 3 in the lateral direction orthogonal to the flow of the fluid 4, that is, the width of the blade 3, the range, for example, from 1 μm to 100 μm is exemplified in the micro flow-path device. If the blade width is small, a large number of flow paths 6 per unit area of the substrate 2 can be secured, and therefore it is considered that the transport efficiency of the fluid 4 can be increased.

As the erected height of the blade 3 from the surface of the substrate 2, the range, for example, from 5 μm to 100 μm is exemplified in the micro flow-path device. If the erected height is higher, the contact surface area between the surface of the blade 3 and the fluid 4 is increased, and therefore the driving force is increased, and the speed can be increased accordingly.

As the space of the plurality of blades 3 in the lateral direction orthogonal to the flow of the fluid 4, that is, the width of the flow path, the range, for example, from 25 μm to 100 μm is exemplified in the micro flow-path device. If the width of the flow path is within the above range, the surface tension and the capillary phenomenon may occur with high probability without the transport of the fluid 4 being prevented in the micro flow-path device. The width of the flow path can be appropriately set in view of the length, the width, the erected height, and the like of the blade 3.

Fluid-Transport Test Example 1

Figure 4:
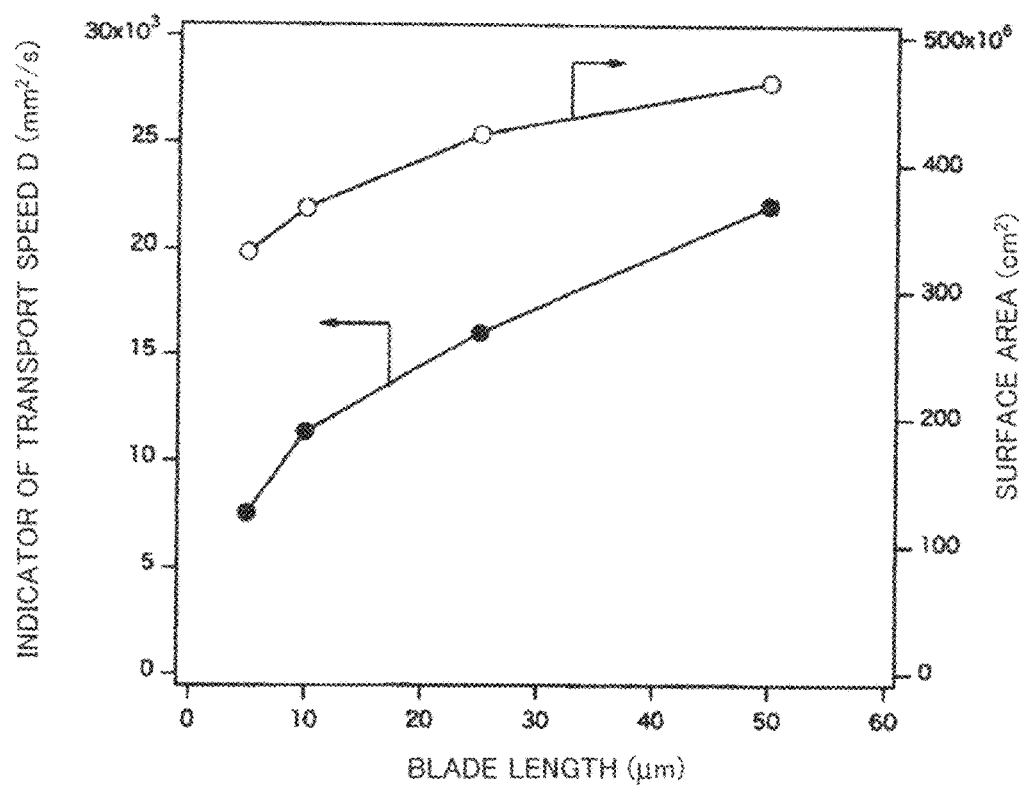
FIG. 4 is a graph illustrating the indicator of the ascending speed of the water D (mm$^2$/s) and the surface area of the flow path (cm$^2$) when the blade length is changed in the combined-blade-type open flow path device in FIG. 1.

FIG. 4 is a graph illustrating the indicator of the ascending speed of the water D (mm$^2$/s) and the surface area of the flow path (cm$^2$) when the length of the blade 3 is changed in the combined-blade-type open flow path device 1 in FIG. 1. In the present test example, the width of the blade 3 is 2 μm, and the width of the flow path 6 is 25 μm. As shown in FIG. 4, in the range where the length of the blade 3 is 50 μm or less, as the length of the blade 3 is longer, the contact surface area with the water being the fluid 4 is increased, and therefore the driving force is increased, and the increase in speed was observed accordingly. It should be noted that even in the open flow path device in which the width of the flow path is set as 50 μm, the tendency similar to the above is confirmed.

The plurality of blades 3 may be disposed in a plurality of rows so that the positions of the spaces 5 are aligned, or may be disposed in a plurality of rows so that the positions of the spaces 5 are shifted in the lateral direction orthogonal to the flow of the fluid 4. For example, the arrangement patterns of the blades 3 are shifted periodically, whereby the positions of the spaces 5 can be shifted. In addition, physical factors may be added to the arrangement patterns of the blades 3 in addition to the shift of the positions of the spaces 5.

Figure 5:
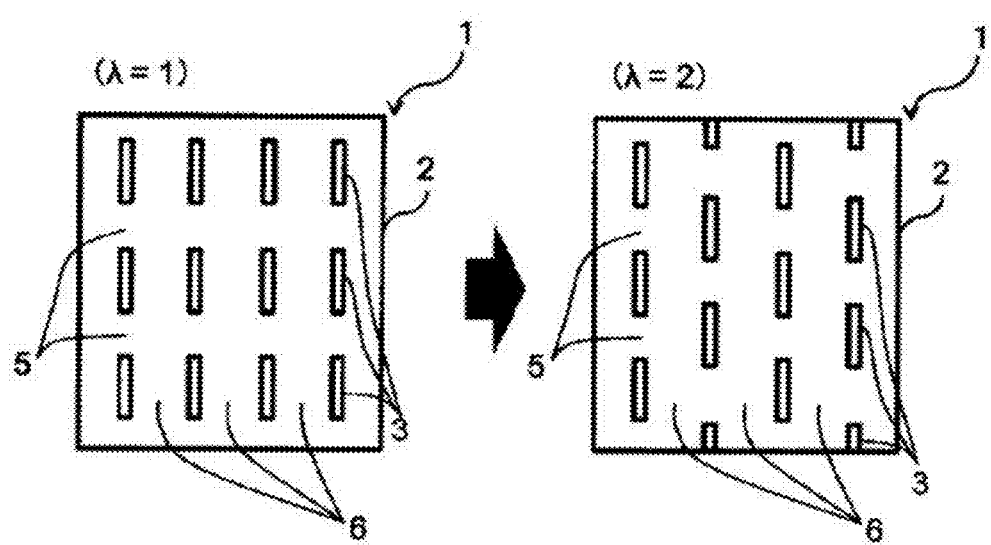
FIG. 5 is a diagram showing a modification where the arrangement patterns of the blades are shifted periodically in the combined-blade-type open flow path device in FIG. 1.

FIG. 5 is a diagram showing a modification where the arrangement patterns of the blades 3 are shifted periodically in the combined-blade-type open flow path device 1 in FIG. 1. The λ denotes a shift parameter, and defines every how many columns the same arrangement pattern appears. The blades 3 erected between the same arrangement patterns are disposed evenly shifted in the direction from the upstream side to the downstream side.

Fluid-Transport Test Example 2

Figure 6:
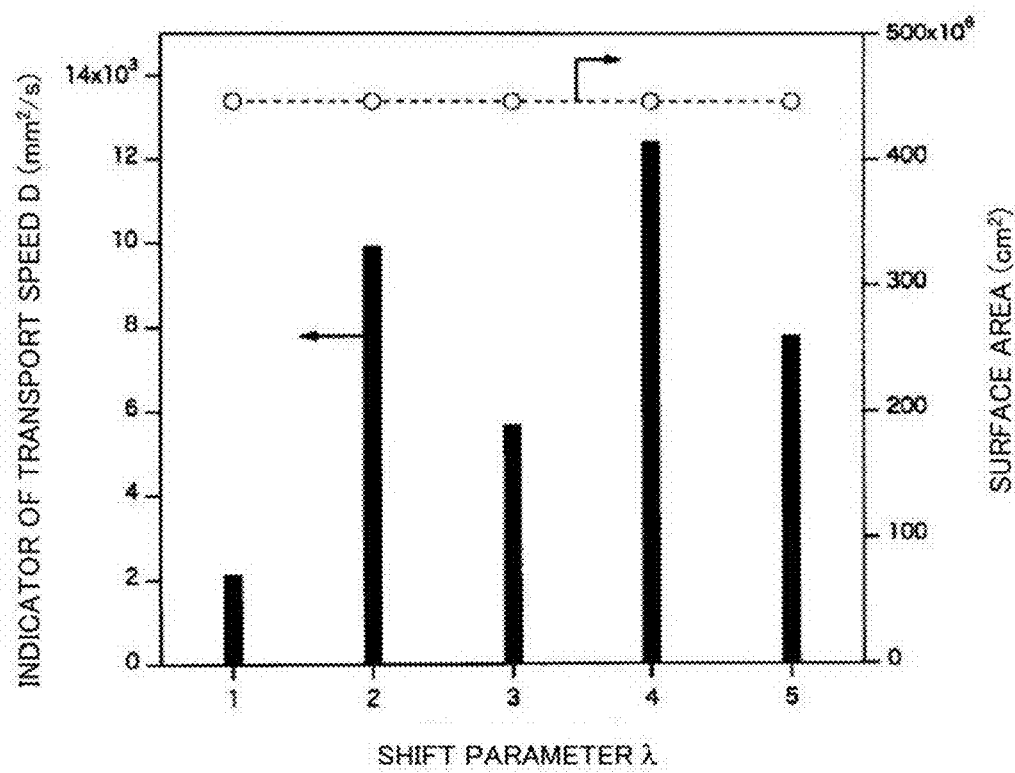
FIG. 6 is a graph illustrating the indicator of the ascending speed of the water D (mm$^2$/s) and the surface area of the flow path (cm$^2$) in the modification where the arrangement patterns of the blades are shifted periodically in the combined-blade-type open flow path device.

FIG. 6 is a graph illustrating the indicator of the ascending speed of the water D (mm$^2$/s) and the surface area of the flow path (cm$^2$) in the modification where the arrangement patterns of the blades 3 are shifted periodically in the combined-blade-type open flow path device 1 in FIG. 5.

In the present test example, in the combined-blade-type open flow path device 1 shown in FIG. 5, it is assumed that the length of the blade 3 is 25 μm, the width of the blade 3 is 2 μm, space 5 between the blades 3 is 20 μm, and the width of the flow path 6 is 50 μm, and only the shift parameter λ is changed. As shown in FIG. 6, an increase in the transport speed of the fluid 4 is observed by change of the λ value although the surface area per unit area of the substrate 2 is identical. From this, it is confirmed that the fluid transport performance of the flow path 6 of the combined-type open flow path device 1 is improved by the periodical shift of the arrangement patterns of the blades 3.

Fluid-Transport Test Example 3

In the combined-blade-type open flow path device 1 shown in FIG. 5, it was assumed that the length of the blade 3 is 50 μm, the width of the blade 3 is 2 μm, the space 5 between the blades 3 is 10 μm, the width of the flow path 6 is 20 μm, and the combined-blade-type open flow path devices with the shift parameter λ=1 and λ=2 were manufactured. The substrate was dipped into the water perpendicularly to the liquid surface of the water by using the combined-blade-type open flow path device, and the transport speeds of the water moving in the flow path in the vertical direction and the horizontal direction were compared. As a result, it was confirmed that the arrangement of λ=2 is superior for the transport of the water in the vertical direction, and the arrangement of λ=1 is superior for that in the horizontal direction. From this, it was found that the transport direction of the fluid 4 can be controlled by the arrangement of the blades 3. In addition, in the case of λ=2, in the transport of the water in the horizontal direction, it was suggested there is a case where the effect of the capillary phenomenon cannot be sufficiently obtained depending on the arrangement patterns.

The number of the arranged columns of the plurality of blades 3 in the lateral direction orthogonal to the flow of the fluid 4, that is, the number of columns of the blades is not particularly limited. The transport amount of the fluid 4 can be increased as the number of columns of the blades is larger.

It should be noted that the plurality of blades 3 may have the same lengths and widths of the blade, or may have the different lengths and widths of the blade.

The combined-blade-type open flow path device 1 of the present invention can arbitrarily adjust the transport speed of the fluid 4 by the hydrophilic or hydrophobic treatment of the surfaces of the substrate 2 and the blade 3. Due to including these functions, the combined-blade-type open flow path device 1 of the present invention can even spontaneously separate the mixture of liquids with different polarity by utilizing the difference in transport speed.

In addition, the combined-blade-type open flow path device 1 of the present invention is the open system exposing the plurality of blades 3 being the surface structure of the flow path 6, and therefore the flow path 6 can be easily cleaned.

As the method for cleaning the flow path 6, for example, the UV ozone cleaning, the cleaning with running the water, and the like are exemplified.

The combined-blade-type open flow path device 1 of the present invention can be obtained by providing a plurality of blades 3 on the surface of not only the flat substrate 2, but also the base material with a curved surface.

In addition, the plurality of blades 3 of the combined-blade-type open flow path device 1 of the present invention are disposed within the flow path of the conventionally used micro flow-path device, whereby the flow rate of the micro flow-path device can also be improved. For example, it is exemplified that a plurality of blades 3 are disposed on the inner wall of the medical catheter and in the flow path of the microfluidic device.

The combined-blade-type open flow path device 1 of the present invention is installed on the wall surface and the like of the building, whereby the device can also be used as a large-scale flow path, the atmosphere in the building can also be maintained in a wet state, and the device can also be used for the freshness maintenance of fresh food, influenza prevention, and the like.

In addition, assuming that the combined-blade-type open flow path device 1 of the present invention is a unit block, a plurality of the unit blocks are joined, whereby a combined-blade-type open flow path device joined body can be obtained. Using this combined-blade-type open flow path device joined body enables a large amount of fluid 4 to be transported over long distances.

In still another embodiment of the present invention, for example, the substrate 2 and the plurality of blades 3 are molded in separate bodies, slits and the like are provided on the surface of the substrate 2, and the insertion and the movement of the blades 3 are set free, whereby the combined-type open flow path device 1 with movable blades where the plurality of blades 3 are slidable in the slits of the substrate 2 may be obtained.

Furthermore, in the combined-type open flow path device 1 with the movable blades where the blades 3 are made slidable in this way, the movement device allowing the blades 3 to move, the control transfer device causing the movement device to transmit the movement instruction, and the like are combined, whereby the combined-blade-type open flow path device 1 capable of adjusting the flow rate of the fluid 4 flowing through the flow path 6 in real time can be constructed.

Figure 7:
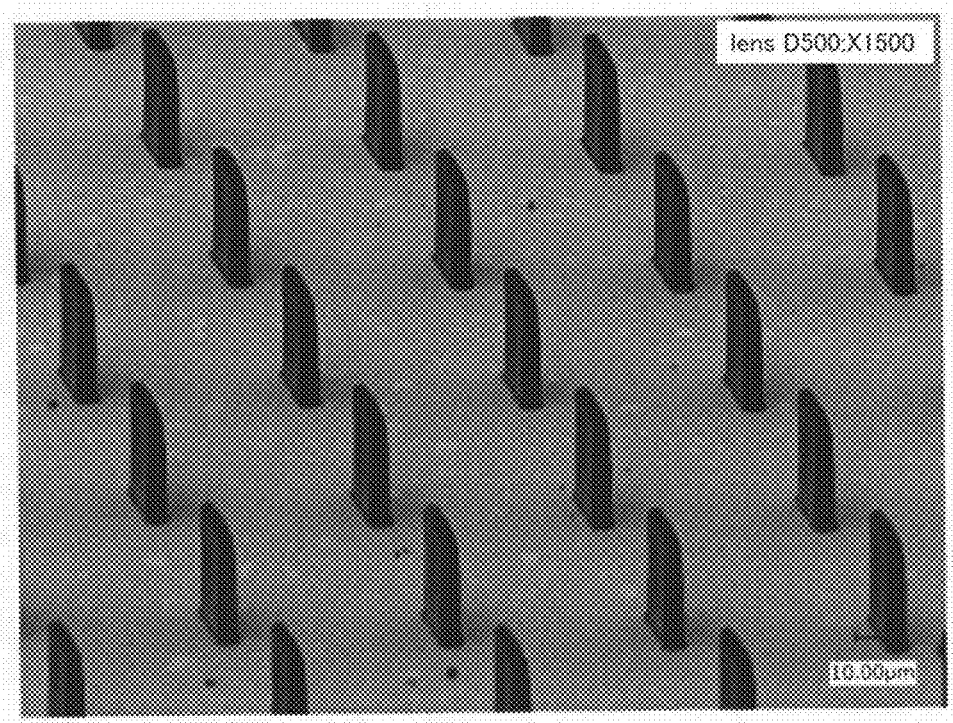
FIG. 7 is an SEM image showing an enlarged part of the flow path with respect to the manufacturing example of the micro flow-path device according to the first embodiment of the present invention.

FIG. 7 is an SEM image showing an enlarged part of the flow path with respect to the manufacturing example of the micro flow-path device according to the present embodiment. In this micro flow-path device, blades manufactured on the silicon wafer of 25 mm×10 mm by photolithography using the epoxy-based resist material (SU-8) as the projection structure imitating the leg of a wharf roach are disposed. The parameters related to the structure of the micro flow-path device are shown below:

blade length: 25 µm;
blade width: 2 µm;
erected blade height: 30 µm;
space between the blades: 50 µm;
width of the flow path: 50 µm; and
shift parameter $\lambda$=5.

Fluid-Transport Test Example 4

Figure 8:
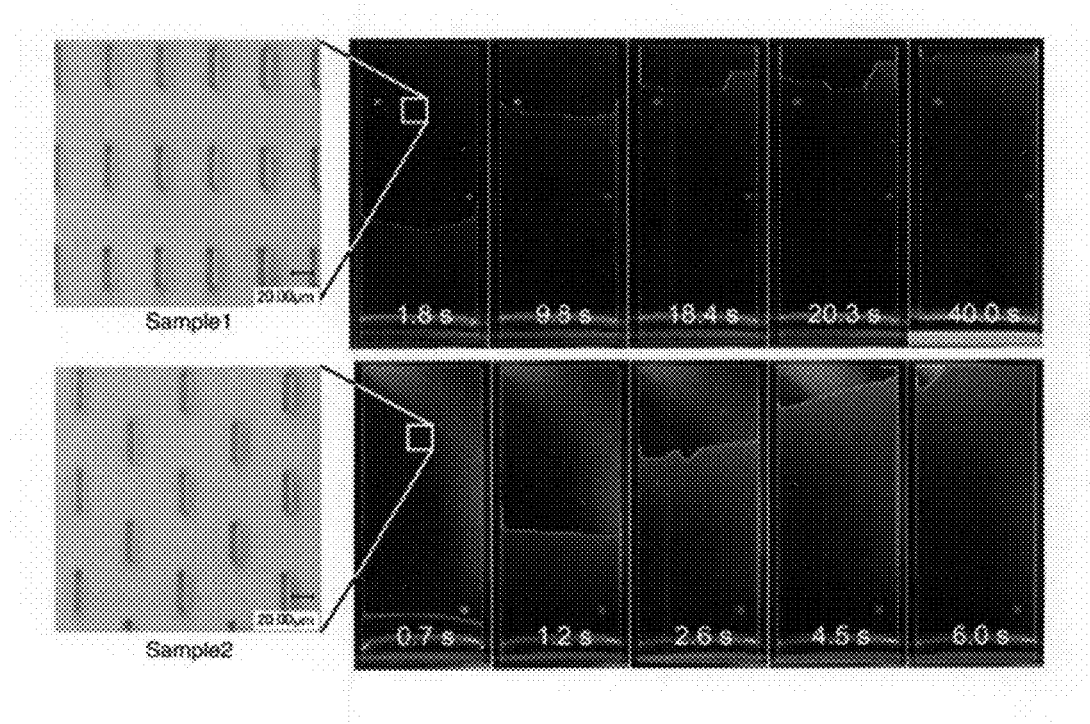
FIG. 8 is a photograph showing the results of observation of the transport behavior of the water by using the micro flow-path device with the arrangement of A=1 (Sample 1) and the arrangement of A=2 (Sample 2).

FIG. 8 is a photograph showing the results of observation of the transport behavior of the water by using the micro flow-path device including the same configuration as that of the micro flow-path device shown in FIG. 7 except the arrangement of $\lambda$=1 (Sample 1) and the arrangement of $\lambda$=2 (Sample 2). Each of the substrate and the surface of the blade is given the oxidation treatment (hydrophilic treatment) by vacuum ultraviolet irradiation. As shown in FIG. 8, it is found that the fluid can be transported by using the micro flow-path device according to the present embodiment including the projection structure imitating the leg of a wharf roach.

Fluid-Transport Test Example 5

The transport behavior of the water, the hexadecane, and the silicon oil is analyzed by using the micro flow-path device including the arrangement of $\lambda$=1 used in the above test example 4. The surface of the silicon wafer substrate and the blade (SU-8) was not treated, or homogeneously treated with hydrophilic treatment or hydrophobic treatment, and the relationship between the chemical properties of the surface and the fluid behavior was analyzed.

When the surface of the substrate and the blade was not given the modification treatment (non-treatment), the contact angle of the hexadecane was about 30°, the contact angle of the silicon oil was less than 1°, and both of the transport performance was good. On the other hand, the contact angle of the water was about 70°, and the transport performance to the upper end portion of the flow path was not confirmed.

In addition, when the surface of the substrate and the blade was given the hydrophobic treatment by chemical vapor deposition (CVD) using TEMS (triethoxy methyl silane), the contact angle of the hexadecane was reduced to approximately 10°, and excellent transport performance was confirmed as compared with the non-treatment. It should be noted that the contact angle and the transport performance of the silicon oil and the water were the same as those in the case of non-treatment.

On the other hand, when the surface of the substrate and the blade was given the hydrophilic treatment by the excimer irradiation, the contact angle was less than 1° (nearly 0°), and excellent transport performance was confirmed in any of the water, the hexadecane, and the silicon oil.

From these results, in the combined-blade-type open flow path device of the present invention, it was confirmed that various fluids could be transported by selection of the method of performing the surface modification of the substrate and the blade.

Fluid-Transport Test Example 6

By using the micro flow-path device including the arrangement of $\lambda$=1 used in the above test example 4, a total of three cycles were repeatedly performed on the surface of the silicon wafer substrate and the blade (SU-8) with the hydrophilic treatment by excimer irradiation and the hydrophobic treatment by chemical vapor deposition (CVD) using TEMS or FAS as one cycle, and the transport performance of the fluid after each of the surface modification treatment was analyzed.

As a result, after the hydrophilic treatment by the excimer irradiation, the contact angle was less than 1° (nearly 0°), and excellent transport performance was confirmed in any of the water, the hexadecane, and the silicon oil.

In addition, after the hydrophobic treatment by chemical vapor deposition (CVD) using TEMS or FAS, although an increase in the contact angle of the hexadecane and the silicone oil was found as compared with after the hydrophilic treatment, the transport performance to the upper end portion of the flow path was confirmed. On the other hand, the contact angle of the water after the hydrophobic treatment was greatly increased, and therefore the transport performance to the upper end portion of the flow path was not confirmed.

These fluid behaviors had the reproducibility through the three cycles of the hydrophilic treatment and the hydrophobic treatment.

From these results, in the combined-blade-type open flow path device of the present invention, it was confirmed that the surface of the substrate and the blade can be appropriately changed to be hydrophilic or hydrophobic.

Fluid-Transport Test Example 7

Figure 9:
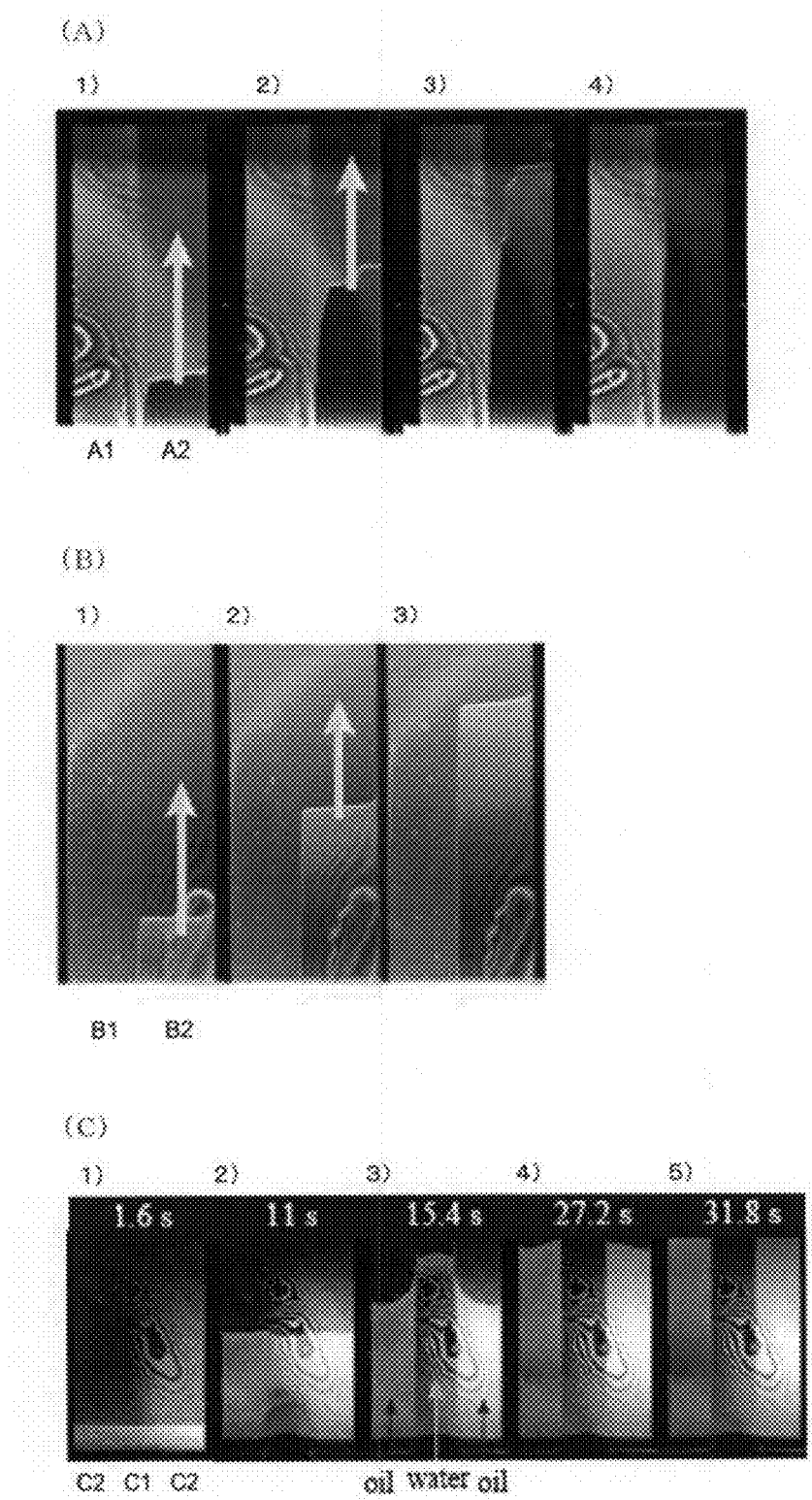
FIGS. 9(A) to 9(C) are photographs showing the results of the fluid-transport test example 7.

In the micro flow-path device including the arrangement of $\lambda=1$ used in the above test example 4, the surface of the silicon wafer substrate and the blade (SU-8) was partially treated by using the methods shown in the following (A) to (C), and the transport behavior of the fluid was analyzed. The results are shown in FIGS. 9(A) to 9(C).

(A) After the excimer irradiation was performed in a state where one side of the substrate (in the range of 5 mm×25 mm) was covered with a photomask, the hydrophobic treatment was performed by chemical vapor deposition (CVD) using FAS (fluorinated alkyl silane). As a result, the micro flow-path device including the portion (A1) where the excimer irradiation and the hydrophobic treatment were performed and the portion (A2) where only the hydrophobic treatment was performed was obtained. When one end of the flow path of the micro flow-path device was brought into contact with the silicon oil, the silicon oil was selectively transported from the flow path of A2 as indicated by an arrow in FIG. 9(A).

(B) After the excimer irradiation was performed on the entire substrate, the hydrophobic treatment was performed by chemical vapor deposition (CVD) using FAS (fluorinated alkyl silane), and furthermore, the excimer irradiation was performed again in a state where one side of the substrate (in the range of 5 mm×25 mm) was covered with a photomask. As a result, the micro flow-path device including the portion (B1) where the excimer irradiation and the hydrophobic treatment were performed and the portion (B2) where the excimer irradiation was performed, in addition to the excimer irradiation and the hydrophobic treatment, was obtained. When one end of the flow path of the micro flow-path device was brought into contact with the mixed solution of the water and the hexadecane, only the hexadecane was selectively transported from the flow path of B2 as indicated by an arrow in FIG. 9(B).

(C) The hydrophilic treatment was performed by the excimer irradiation in a state where both sides of the substrate (each in the range of 3.5 mm×25 mm) were covered with photomasks. As a result, the micro flow-path device including the portion (C1) where the excimer irradiation was performed and the two non-treatment portions (C2) was obtained. When one end of the flow path of the micro flow-path device was brought into contact with the mixed solution of the silicon oil and the water, the water was selectively transported from the flow path of C1 in the center, and the silicon oil was selectively transported from the flow path of C2 on both sides as indicated by the arrows in FIG. 9(C).

From these results, in the combined-blade-type open flow path device of the present invention, the surface of the substrate and the blade was given the hydrophilic treatment and the hydrophobic treatment, or the combination with the non-treatment, depending on the type of the fluid, the required performance of the combined-blade-type open flow path device, and the like, and the hydrophilic region and the lipophilic region were provided in the flow path and the surface free energy was controlled, whereby it was confirmed that the desired fluid could be transported region-selectively, and the oil-water separation could be achieved if the fluid was an oil-water mixed solution.

Fluid-Transport Test Example 8

In the same manner as in the micro flow-path device used in the above test example 4, the micro flow-path device where a plurality of blades were disposed on the silicon wafer 25 mm by 10 mm was produced by photolithography using an epoxy-based resist material (SU-8). In this test example, the blade length, the width of the flow path, and the shift parameter ($\lambda$) were variously changed, and the relationships between the number and the size of the blades and the arrangement of the blades, and the transport behaviors of the water and the silicon oil were analyzed. The results are shown in FIGS. 10(A) and 10(B).

Figure 10:
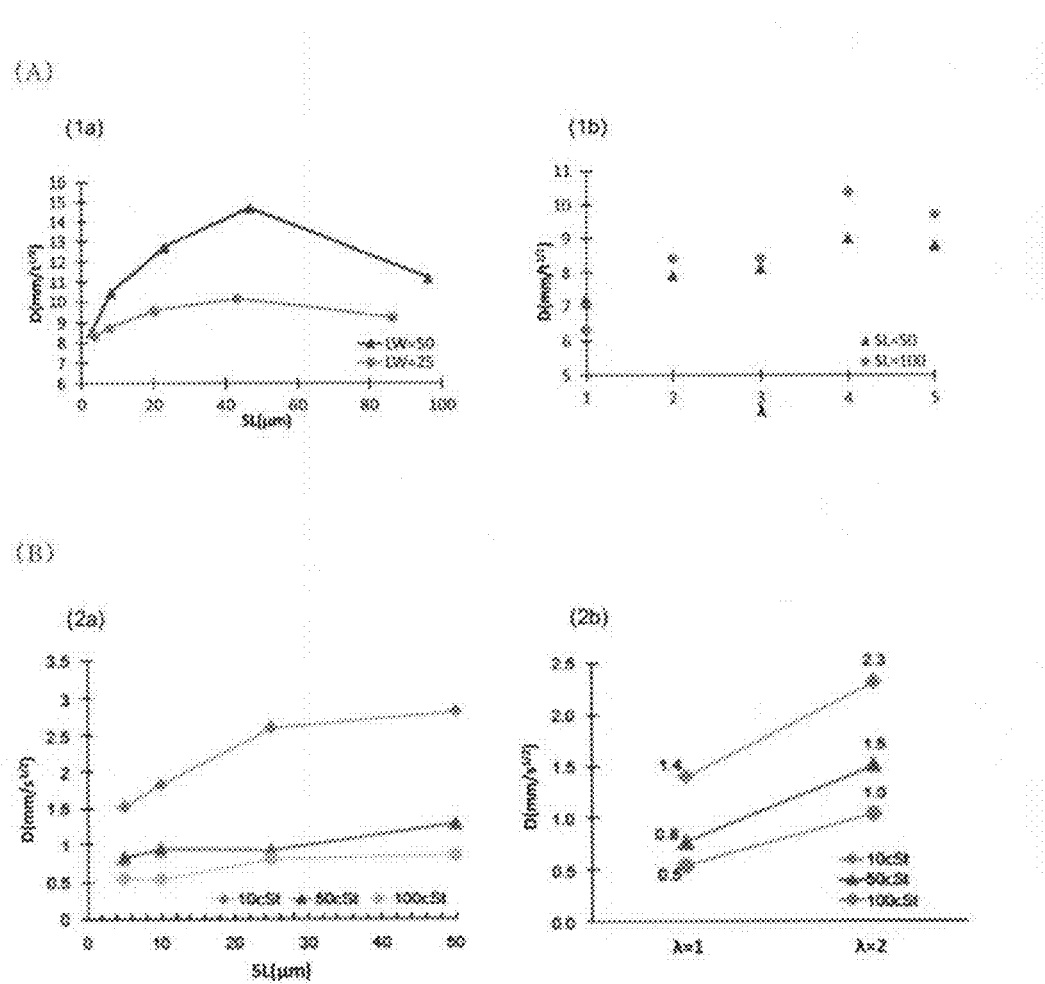
FIGS. 10(A) and 10(B) are graphs showing the results of the fluid-transport test example 8.

When the water was used as the fluid, as shown in (1a) of FIG. 10(A), when the blade length (SL) was in the range of 50 μm or less, an increase in the indicator D of the ascending speed of the water against the gravity force was observed as the blade length (SL) becomes longer. On the other hand, when the blade length becomes 50 μm or more, it was observed that the D tends to decrease. It should be noted that the LW denotes the width of the flow path in (1a) of FIG. 10(A).

In addition, regarding the arrangement of the blade, if the value of $\lambda$ was two or more as shown in (1b) of FIG. 10(A), the indicator D of the ascending speed of the water against the gravity force increases as compared with the case of $\lambda=1$, and the increase of the transport speed was observed.

When the silicone oil (kinematic viscosity cSt=10, 50, 100) was used as the fluid, as shown in (2a) of FIG. 10(B), when the blade length (SL) was in the range of 50 μm or less, it was observed that the indicator D of the ascending speed of the silicone oil against the gravity force tends to increase due to the increase in the blade length (SL). It should be noted that when the kinematic viscosity of the silicone oil was 50 cSt, or 100 cSt, the correlation between the blade length and the D was slightly weak as compared with the case of the kinematic viscosity of 10 cSt.

In addition, regarding the arrangement of the blade, as shown in (2b) of FIG. 10(B), in the device where the blade length was 100 μm, in the case of $\lambda=2$, as compared with the case of $\lambda=1$, the indicator D of the ascending speed of the silicone oil against the gravity force was increased for the silicon oil with any of the kinematic viscosity, and a remarkable increase of the transport speed was observed.

From these results, in the combined-blade-type open flow path device of the present invention, it was suggested that there was a certain correlation between the shift of the position of the blade space in the flow path and the indicator D of the ascending speed of the fluid against the gravity force. In addition, when the viscosity of the fluid was high, it was suggested that the change of the arrangement pattern of the blade was more effective for the improvement of the transport speed than the increase in the surface area in contact with the fluid by the change of the number and the size of the blades.

Fluid-Transport Test Example 9

Next, by using the micro flow-path device including the arrangement of $\lambda=1$ and $\lambda=2$ used in the above test example 4, regarding the transport of the water, the state of the lines (Three phase Contact Line: TCL) where the three phases of the gas-liquid-solid positioned in the upper end portion of the ascending water were in contact with each other was analyzed. The results are shown in FIGS. 11(A) to 11(B).

Figure 11:
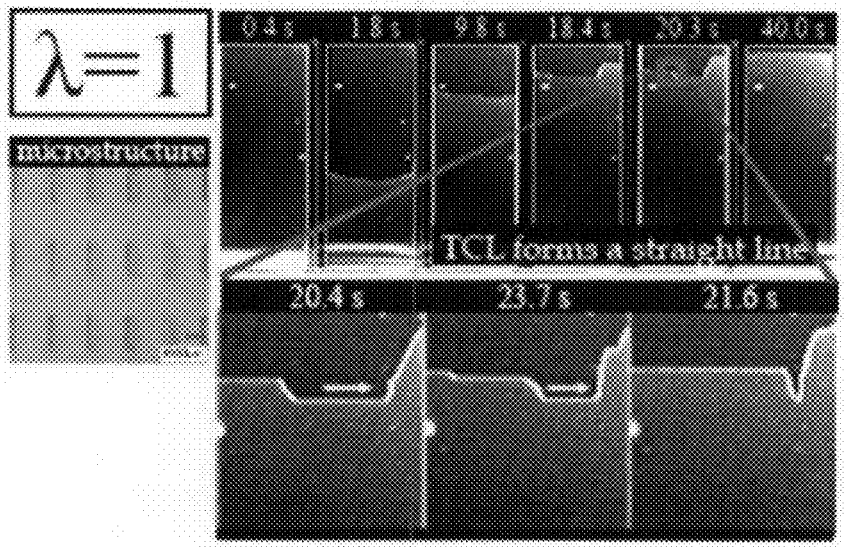
FIGS. 11(A) to 11(B) are photographs showing the results of the fluid-transport test example 9.
Figure 11:
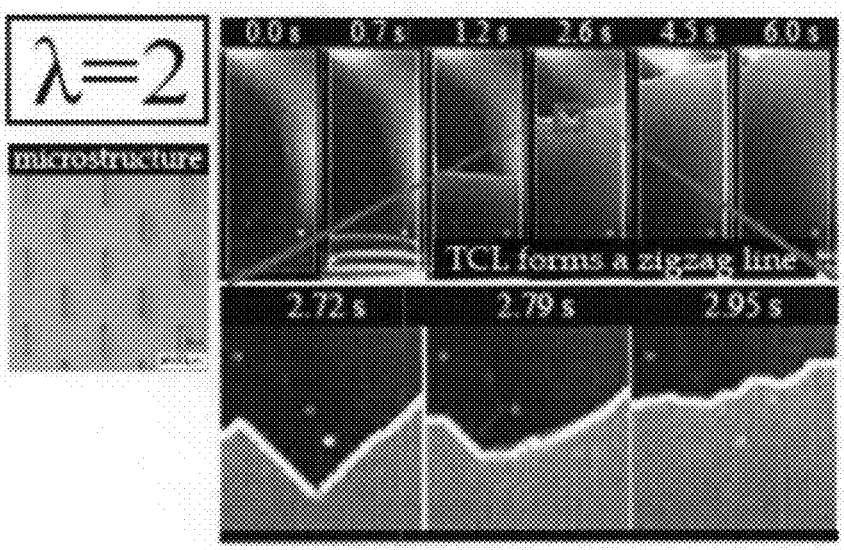

As each is enlarged to be shown in FIGS. 11(A) and 11(B), in the case of $\lambda=2$, it is found that the shape of the TCL stepwisely changes as time passes as compared with the case of $\lambda=1$. More specifically, in the early stages of the transport, it was observed that the TCL ascended while maintaining the shape perpendicular to the traveling direction of the water, and after a certain period of time elapsed, the state (transition) where the TCL changed in a zigzag form along the angle of the arrangement patterns of the blades.

Before this transition occurs, in the flow path of $\lambda=2$, although the TCL forms a horizontal shape as in the case of the flow path of $\lambda=1$, the TCL is always in contact with the arrangement structure of the blades, whereby the driving force stabler than in the case of the flow path of $\lambda=1$ can be obtained. After the transition, the TCL becomes a more complex shape, and the TCL length increases. The surface tension of the fluid serving as the driving force of the fluid transport increases in proportion to the TCL length, and therefore it was suggested that faster fluid transport could be achieved by the change of $\lambda$.

Thus, the micro flow-path devices where the size and the arrangement of the blades were systematically changed were produced, the TCL length to be expected in the state after the transition where the shape of the TCL was complicated for each of the devices was calculated, and the relationship between the TCL length and the test value of the indicator D of the transport speed of the water against the gravity force was analyzed. It should be noted that the value of the D is a value calculated from the fluid transport speed of the whole including the pre-transition. The results are shown in FIG. 12.

Figure 12:
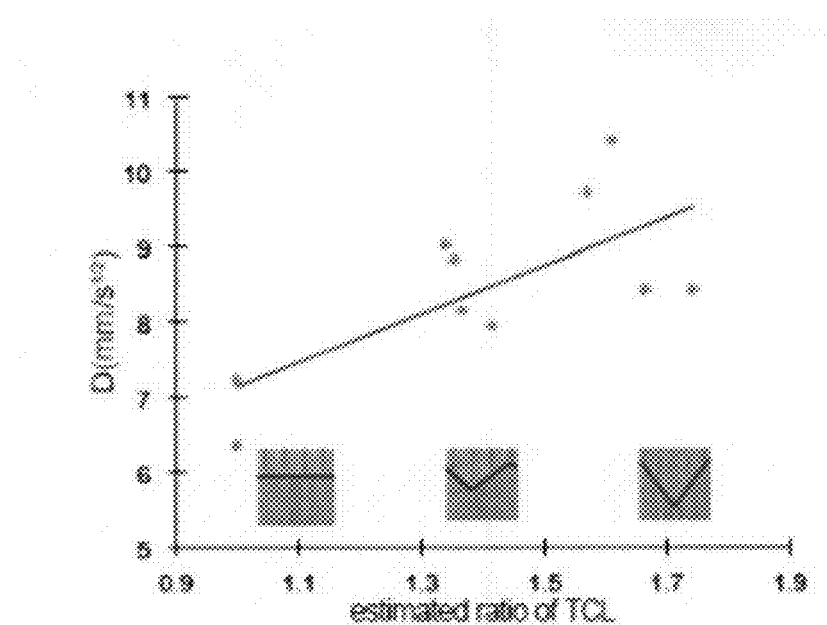
FIG. 12 is a graph showing the relation between the calculated value of TCL length and the test value of the indicator D of the transport speed of the water against the gravity force in the fluid-transport test example 9.

As shown in FIG. 12, a clear correlation between the calculated value of the TCL length and the fluid transport speed was confirmed. It should be noted that in FIG. 12, the horizontal axis represents the ratio of the TCL length calculated for device to be analyzed to the TCL length of the flow path of $\lambda=1$.

Thus, it was confirmed that the combined-blade-type open flow path device of the present invention could control the transport performance of the desired fluid by the design of the number and size of the blades and the arrangement pattern of the blades depending on the type, the composition, and the physical properties of the fluid, and the application and the required performance, and the like of the combined-blade-type open flow path device 1. In addition, the modification treatment of the surface of the substrate and the blade described above is combined, whereby the fluid can be transported more efficiently.

Figure 13:
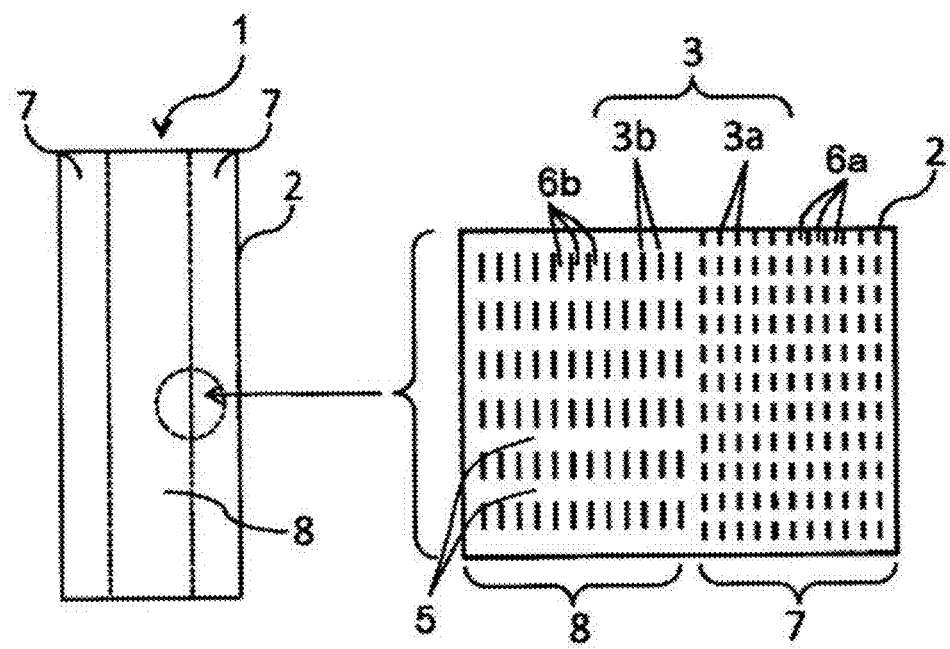
FIG. 13 is a diagram illustrating a second embodiment of the combined-blade-type open flow path device of the present invention.

FIG. 13 is a diagram illustrating a second embodiment of the combined-blade-type open flow path device 1 of the present invention. In this embodiment, as a plurality of blades 3, a first blade 3a with a short length in the direction from the upstream side to the downstream side of the flow of the fluid 4, and a second blade 3b with a length longer than that of the first blade 3a in the direction from the upstream side to the downstream side of the flow of the fluid 4 are formed, and a combined structure of a plurality of blades 3 with these different lengths are taken.

Regarding the arrangement of the first blades 3a and the second blades 3b with different lengths, the first blade 3a and the second blade 3b may be disposed on the same straight line in the direction from the upstream side to the downstream side of the flow of the fluid 4, and only the first blades 3a or only the second blades 3b may be disposed on the same straight line in the direction from the upstream side to the downstream side of the flow of the fluid 4. It is preferred that the first blades 3a with a short length are disposed in the outermost portion 7 of the combined-blade-type open flow path device 1, and the second blades 3b with a length longer than that of the first blades 3a are disposed in the central portion 8 surrounded by the first blades 3a.

FIGS. 14(A) and 14(B) are graphs for quantitatively assessing the impact of the three parameters of the length of the blade 3, the space 5 between the blades 3, and the width of the flow path 6 on the ascending speed of the water in the combined-blade-type open flow path device 1. In FIG. 14(A), for the single patterns of the flow path 6a where only the first blades 3a with a short length are disposed and the flow path 6b where only the second blades 3b with a length longer than the first blades 3a are disposed, the respective results are shown.

(1a) to (1c) of FIG. 14(A) show the change in the indicator D (mm$^2$/s) of the ascending speed of the water in the combined-blade-type open flow path device 1 produced with any one of the three parameters described above varied and the remaining two fixed. Those plotted with circles are the data of the flow path 6a constituted by only the second blades 3b disposed in the central portion 8 in the combined-blade-type open flow path device 1 of the second embodiment of the present invention shown in FIG. 13. In addition, in the inset in the figure, those plotted with squares are the data of the flow path 6b constituted by only the first blades 3a disposed in the outermost portion 7 in the combined-blade-type open flow path device 1 of the second embodiment shown in FIG. 13. Then, the curve drawn by a solid line in the figure is a graph showing the theoretical expression of the capillary theory in the flow paths 6a and 6b described below.

(1d) of FIG. 14(A) is a graph for determining the variables $\alpha_1$ and $\beta_1$ of the capillary theory in the flow paths 6a and 6b derived based on the data of the above (1a) to (1c).

Here, the theoretical expression of the capillary theory in the combined-blade-type open flow path device 1 of the present invention is represented by the following expression.

$$D_B/(1-\varphi)D = \alpha_1 + \beta_1 \varphi D_B/(1-\varphi)D_S \quad (1)$$

In equation (1), the D (mm$^2$/s) is an indicator of the ascending speed determined from the experiment, the $D_B$ and the $D_S$ are respectively $D_B = \gamma$ (I+w) h$^2$/$\eta$LW and $D_S = \gamma$ (I+w) w/$\eta$L, the $D_B$ is an indicator of the ascending speed theoretically determined from the competition between the driving force and the resistance force acting on the fluid from the bottom surface of the substrate, and the $D_S$ is an indicator of the ascending speed theoretically determined from the competition between the driving force and the resistance force acting on the fluid from the blade side. Here, the $\gamma$ (N/m) represents a surface tension of the fluid 4, and the $\eta$ (kg/m·s) represents the viscosity of the fluid 4. The $\alpha_1$ is a numerical coefficient attached to the $D_B$, and the $\beta_1$ is a numerical coefficient attached to the $D_S$. In addition, the $\varphi$ represents I/L, that is, the proportion of the blades 3 as seen in the direction from the upstream side to the downstream side of the flow of the fluid 4, and the (1−$\varphi$) represents the ratio of the portion without the blades 3 (see FIG. 16 (a)).

Figure 14:
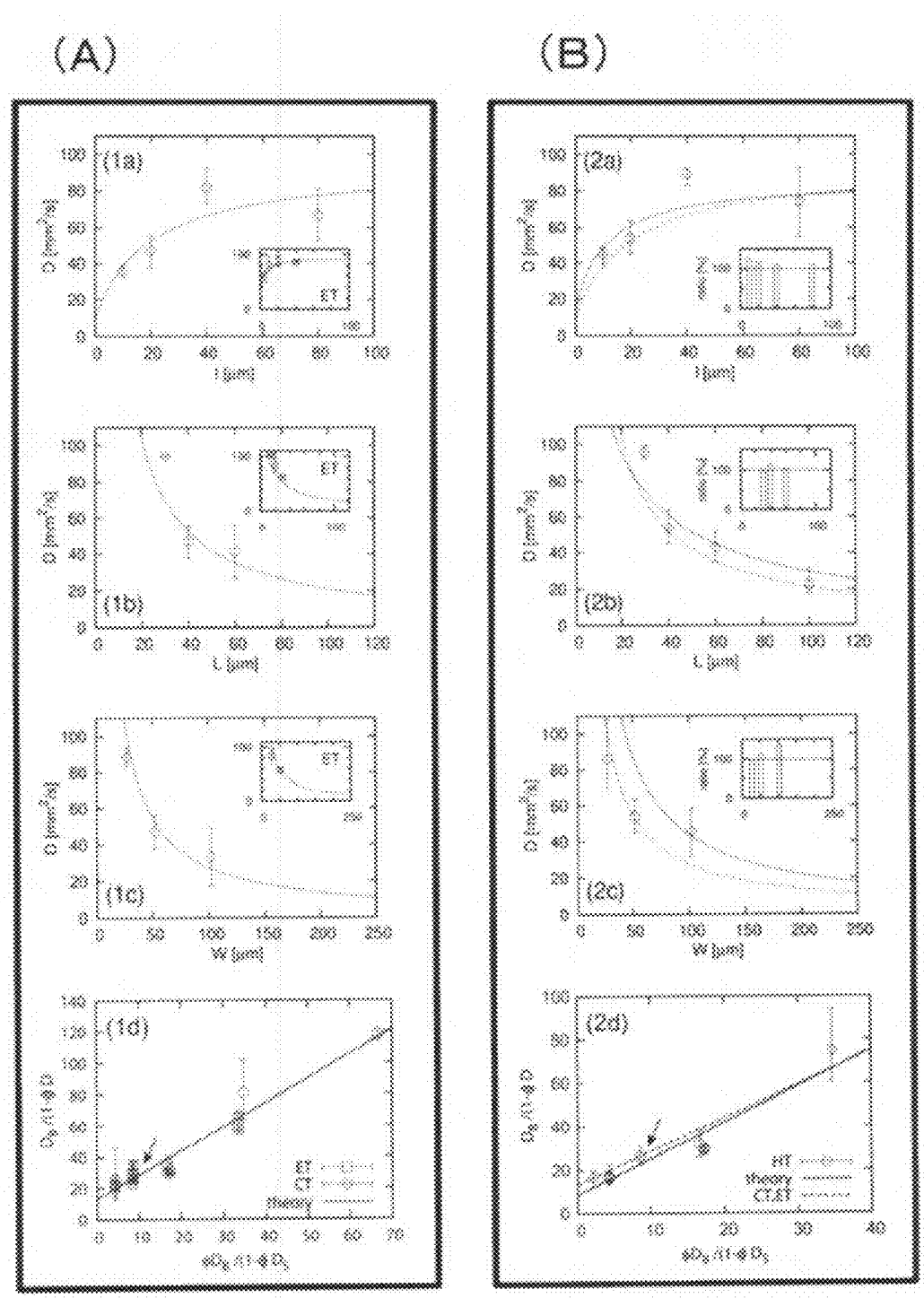
FIGS. 14(A) and 14(B) are graphs for quantitatively assessing the impact of the three parameters of the blade length, the space between the blades, and the width of the flow path on the ascending speed of the water in the combined-blade-type open flow path device shown in FIG. 13.

In (1d) of FIG. 14, the vertical axis of the graph represents the left-hand side of equation (1), and the horizontal axis of the graph represents the portion ($\varphi D_B/(1-\varphi) D_S$) obtained by the removal of the coefficient $\beta 1$ from the second term of the right-hand side of equation (1). If the capillary theory holds well in the combined-blade-type open flow path device 1 of the present invention, the data are plotted in a straight line, where the gradient is $\beta_1$, and the y-intercept is $\alpha_1$.

In (1a) of FIG. 14, the vertical axis represents the indicator D (mm$^2$/s) representing the ascending speed of the water measured in the experiment, and the horizontal axis represents the blade length l ($\mu$m). Each of the value of the blade space L ($\mu$m) in the flow direction of the fluid 4 and the value of the blade width W ($\mu$m) in the direction orthogonal to the flow of the fluid was fixed to (L, W)=(20, 50) for the flow path 6a, and to (L, W)=(10, 25) for the flow path 6b. From this, it is confirmed that as the blade length l is longer, the ascending speed of the water is increased.

In (1b) of FIG. 14, the vertical axis represents an indicator D (mm$^2$/s) representing the ascending speed measured in the experiment, and the horizontal axis represents a blade period L (blade space L+blade length l) (μm) in the direction of the flow of the fluid. Each of the other parameters was fixed to (l, W)=(20, 50) for the flow path 6a, and fixed to (l, W)=(10, 25) for the flow path 6b. From this, it is confirmed that as the blade space L in the flow direction of the fluid is smaller, the ascending speed is increased.

In (1c) of FIG. 14, the vertical axis represents an indicator D (mm$^2$/s) representing the ascending speed measured in the experiment, and the horizontal axis represents a blade period W (width W of the flow path+blade width w) (μm) in the lateral direction orthogonal to the flow of the fluid. Each of the other parameters was fixed to (l, L)=(20, 20) for the flow path 6a, and fixed to (l, L)=(10, 10) for the flow path 6b. From this, it is confirmed that as the blade space W in the direction orthogonal to the flow of the fluid is smaller, the ascending speed is increased.

When all of the data in (1a) to (1c) of FIG. 14(A) and other three kinds of data, that is, (l, L, W)=(20, 20, 50), (10, 20, 50), and (20, 10, 25) (unit: μm) were plotted, the data points were plotted well in a straight line, and from fitting, the $\alpha_1$ and the $\beta_1$ were determined as $\alpha_1$=13.1 corresponding to the y-intercept of the equation of the straight line, and $\beta_1$=1.54 corresponding to the gradient. Furthermore, when theoretical curves are added to (1a) to (1c) by using the values of $\alpha_1$ and $\beta_1$, it is confirmed that the theoretical curves explain the tendency of the data points well.

On the other hand, FIG. 14(B) shows the results of the second embodiment of the present invention shown in FIG. 13, that is, the results of the combined pattern of the flow path 6 where the first blades 3a with a short length are disposed in the outermost portion 7 of the combined-blade-type open flow path device 1, and the second blades 3b with a length longer than that of the first blades 3a are disposed in the central portion 8 surrounded by the first blades 3a.

In FIG. 14(B), the three parameters in the outermost portion 7 were maintained at (l, W, L)=(10, 25, 10), and only the three parameters in the central portion 8 were changed.

In (2a) of FIG. 14(B), the vertical axis represents the indicator D (mm$^2$/s) representing the ascending speed measured in the experiment, and the horizontal axis represents the length l of the second blade 3b (μm) in the central portion 8. The values of the blade space L (μm) in the flow direction of the fluid in the central portion 8 and the blade space W (μm) in the lateral direction orthogonal to the flow of the fluid in the central portion 8 were respectively fixed to (L, W)=(20, 50). From this, it is confirmed that as the length l of the second blade 3b in the central portion 8 is longer, the ascending speed is increased.

In (2b) of FIG. 14(B), the vertical axis represents an indicator D (mm$^2$/s) representing the ascending speed measured in the experiment, and the horizontal axis in the central portion 8 represents a blade period L (blade space L+blade length l) (μm) in the direction of the flow of the fluid. Other parameters were fixed to (l, W)=(20, 50). From this, it is confirmed that as the blade space L in the flow direction of the fluid in the central portion 8 is smaller, the ascending speed is increased.

In (2c) of FIG. 14(B), the vertical axis represents an indicator D (mm2/s) representing the ascending speed measured in the experiment, and the horizontal axis in the central portion 8 represents a blade period W (width W of the flow path+blade width w) (μm) in the lateral direction orthogonal to the flow of the fluid. Other parameters were fixed to (l, L)=(20, 20). From this, it is found that as the blade space W in the lateral direction orthogonal to the flow of the fluid in the central portion 8 is smaller, the ascending speed is increased.

As with (1d) of FIG. 14(A), (2d) of FIG. 14(B) is a graph for determining the variables $\alpha_1$ and $\beta_1$ of the capillary theory in the second embodiment of the present invention derived based on the data of the above (2a) to (2c). All of the data of the above (2a) to (2c) are plotted, and the fitting line for these points is expressed by a solid line. In this case, $\alpha_1$=8.20 and $\beta_1$=1.68 were determined. When theoretical curves are added to the (2a) to (2c) by using the values of α1 and β1, it is confirmed that the theoretical curves expressed by the solid line explain the tendency of the data points well.

Furthermore, the theoretical curves using the $\alpha_1$ and the $\beta_1$ determined in (1d) of FIG. 14(A) were represented by a broken line in (2a) to (2c) of FIG. 14(B). In addition, in the inset in the figures of the (2a) to (2c), the value of the D in the combined pattern was indicated as a ratio (%) of the blades 3b corresponding to the central portion 8 of the combined pattern to the value of the D in the single pattern.

As a result, except for the two data points where the value of the blade space L (μm) for the central portion in the flow direction of the fluid, or the value of the blade space W (μm) for the central portion in the direction orthogonal to the flow of the fluid was small, it was confirmed that the ascent of the water was clearly faster in the flow path of the combined pattern.

When the transport speeds of the fluid in the flow path 6a where only the first blades 3a with a short length are disposed and in the flow path 6b where only the second blades 3b with a length longer than the first blades 3a are disposed are compared, as shown in FIG. 14(A), the transport speed of the fluid 4 in the flow path 6a where only the first blades 3a with a short length are disposed is larger. On the other hand, when one end of the flow path 6 of the combined-blade-type open flow path device 1 where the first blades 3a with a short length are disposed in the outermost portion 7 of the combined-blade-type open flow path device 1, and the second blades 3b with a length longer than that of the first blades 3a are disposed in the central portion 8 surrounded by the first blades 3a is brought into contact with the fluid 4, as shown in FIG. 14(B), it is confirmed that the indicator of the ascending speed of the water is large, and the transport speed of the fluid 4 is large as compared with the single pattern in FIG. 14(A). The improvement of the transport speed of the fluid 4 is caused by the fact that the fluid 4 previously transported to the outermost portion 7 serves to pull up the fluid 4 to the central portion 8 because the transport speed of the fluid 4 to the outermost portion 7 is larger than the transport speed of the fluid 4 to the central portion 8. From the above, in the combined pattern structure, when the length scale in the outermost portion 7 was small enough compared with the length scale in the central portion 8, the outermost portion 7 plays an effective role, and it was found that the ascending speed of the water was increased by the combined effect not observed in the single pattern structure.

Figure 15:
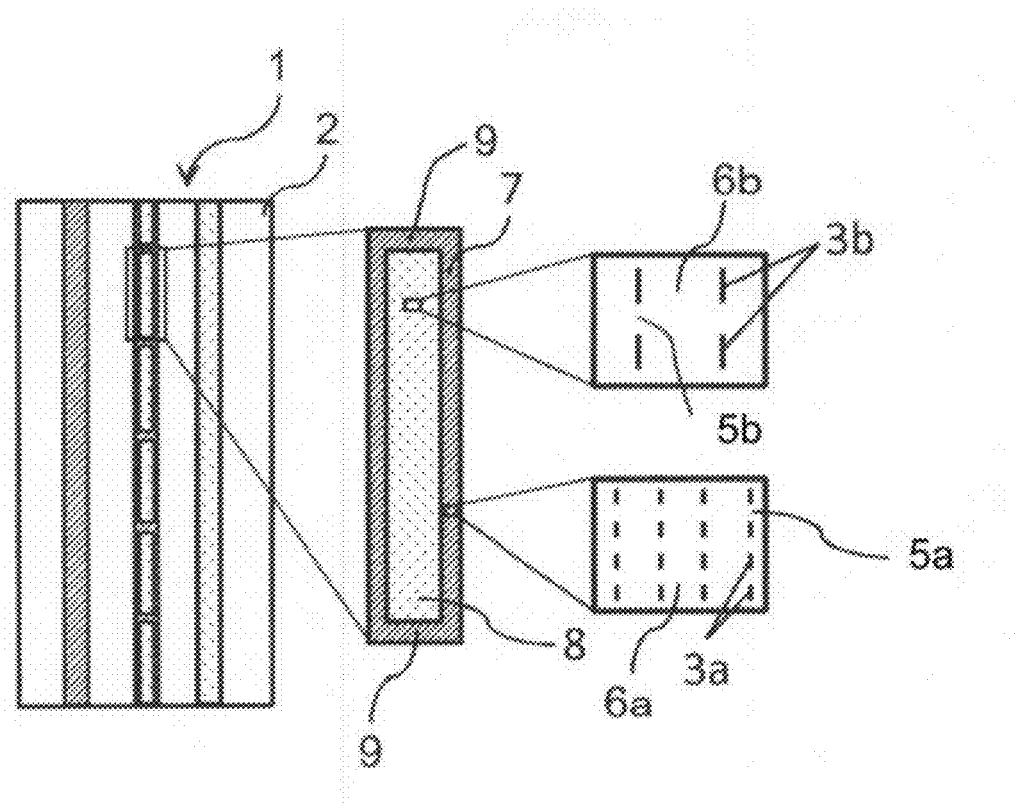
FIG. 15 is a diagram illustrating a third embodiment of the combined-blade-type open flow path device of the present invention.
Figure 16:
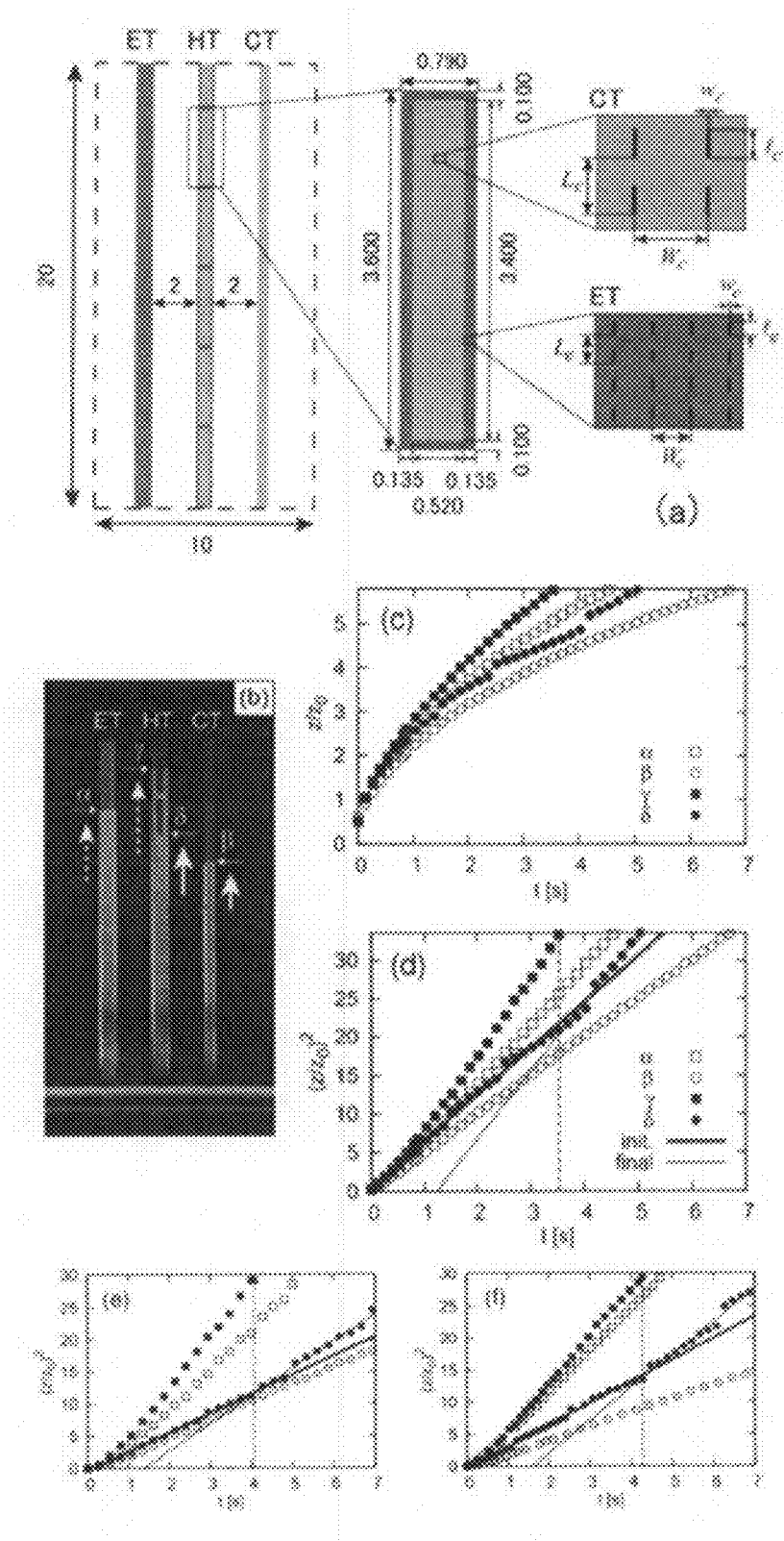
FIG. 16(a) is a diagram showing an example of the third embodiment of the combined-blade-type open flow path device of the present invention.
FIG. 16(b) is a photograph showing the ascent of the water in this case.
FIG. 16(c) is a graph showing the time evolution $z/z_0$ of the height z of the water ascent.
FIG. 16(d) is a graph where the vertical axis of FIG. 16(c) is retaken by the square of $z/z_0$.
FIGS. 16(e) and 16(f) are graphs showing the relation between the time t and the square of the transport distance $z/z_0$ of the water when the value of the blade space L (μm) in the central portion 8 is changed in FIG. 16(d).

FIG. 15 is a diagram illustrating a third embodiment of the combined-blade-type open flow path device 1 of the present invention. In addition, FIGS. 16(*a*) to 16(*f*) are diagrams illustrating an example of the third embodiment of the combined-blade-type open flow path device of the present invention, and FIG. 16(a) shows the size of the combined-blade-type open flow path device of the example. FIG. 16(b) is a photograph showing the ascent of the water in FIG. 16(a), FIG. 16(c) is a graph showing the time evolution $z/z_0$ of the height z of the water ascent, and FIG. 16(d) is a graph where the vertical axis of FIG. 16(c) is retaken by the square of $z/z_0$.

In the third embodiment of the present invention, as shown in the central lane in FIG. 15, the first blades 3a with a short length are arranged in the outermost portion 7 of the combined-blade-type flow path device 1, the second blades 3b with a length longer than the first blades 3a are arranged in the central portion 8, and the first blades 3a with a short length are arranged also in the central portion 8 at regular intervals. In the central portion 8, the region where the first blades 3a with a short length are arranged at regular intervals is set as the boundary portion 9. In the combined-blade-type flow path device 1 in the present embodiment, the silicon wafer is used as the substrate 2, the first blades 3a and the second blades 3b are disposed by photolithography, and full wettability to water is achieved on the surfaces of the substrate 2, the first blades 3a, and the second blades 3b by ultraviolet irradiation.

The combined-blade-type flow path device 1 in the present embodiment combines the outermost portion 7 where the length of the blade 3a is 10 µm and the central portion 8 where the length of the blade 3b is 20 µm as shown in the central lane and in an enlarged view of a portion thereof in FIG. 16(a). In the outermost portion 7, the space 5a of the blade 3a is 10 µm, and the width of the flow path 6a is 25 µm. In the central portion 8, the space 5b of the blade 3b is 20 µm, and the width of the flow path 6b is 50 µm. In addition, the blade height h and the blade thickness w are fixed to 30 µm and 2 µm respectively. Furthermore, as shown in the enlarged view of a portion of the central lane in FIG. 16(a), the first blades 3a are arranged in the boundary portion 9 as with the outermost portion 7, and the length of the boundary portion 9 is 0.1 mm on the upstream side, 0.1 mm on the downstream side, and 0.2 mm in total. On the other hand, in the left side lane in FIG. 16(a), only the first blades 3a are arranged in a plurality of lines as with the outermost portion 7 as a comparative example, and in the right side lane, only the second blades 3b are arranged in a plurality of lines as with the central portion 8 as a comparative example.

FIG. 16(b) is a photograph showing the water-absorbing behavior of the flow path 4 in the three lanes. The α indicates the ascending front end of the water in the left side lane being the comparative example where only the first blades 3a are arranged in a plurality of lines as with the outermost portion 7, and the β indicates the ascending front end of the water in the right side lane being the comparative example where only the second blades 3b are arranged in a plurality of lines as with the central portion 8. In addition, the γ indicates the ascending front end of the water in the outermost portion 7 in the central lane being an example, and the δ indicates the ascending front end of the water in the central portion in the central lane being an example. As shown in FIG. 16(b), the boundary portion 9 is provided in the flow path device where the first blades 3a with a short length are arranged in the outermost portion 7, and the second blades 3b with a length longer than the first blades 3a are arranged in the central portion 8, whereby it is confirmed that the transport distance of the fluid 4 increases, as compared with the flow path device where only the same blades 3a as in the outermost portion 7 are arranged in a plurality of lines, and the flow path device where only the same blades 3b as in the central portion 8 are arranged in a plurality of lines.

FIG. 16(c) is a graph showing the relationship between the time t and the ascending height z of the water. The vertical axis of the graph represents the ascending height z of the liquid normalized by the period $z_0$ (3.6 mm) of the boundary portion 9 (the space of the boundary portion 9 (3.4 mm)+the length of the boundary portion 9 (0.2 mm)), and the horizontal axis represents the elapsed time t. The α indicates the ascending height of the water in the left side lane in FIGS. 16(a) and 16(b) where only the blades 3a same as in the outermost portion 7 are arranged in a plurality of lines, and the β indicates the ascending height of the water in the right side lane in FIGS. 16(a) and 16(b) where only the same blades 3b as in the central portion 8 in FIG. 15 are arranged in a plurality of lines. In addition, the γ indicates the ascending height of the water in the outermost portion 7 of the central lane in FIGS. 16(a) and 16(b), and the δ indicates the ascending height of the water in the central portion 8 of the central lane in FIGS. 16(a) and 16(b).

From FIGS. 16(b) and 16(c), it is confirmed that there are a number of features very different from the ordinary capillary ascending in the dynamics of the penetration of the water in the central lane of the present embodiment. That is, both of the penetrations of the water into the outermost portion 7 and into the central portion 8 in the central lane are faster than the penetration of the water into the flow path in the left and right side lanes being the single pattern. Here, when the penetration speed of the water into each lane is compared, the penetration of the water into the left side lane (α) is faster than the penetration of the water into the right side lane (β). This is because the blade length in the left side lane is shorter than that in the right side lane, and as a result, the capillary force is stronger. In addition, the water penetration in the outermost portion 7 in the central lane (γ) is faster than the water penetration into the left side lane (α) (see vertical arrow in the broken line). Furthermore, the water penetration into the central portion 8 in the central lane (δ) is faster than the water penetration into the right side lane (β) (see vertical arrow in the solid line). This is caused by the fact that in the central lane, the water previously penetrating into the outermost portion 7 (γ) pulls up the water in the central portion 8.

FIG. 16(d) is a graph where the vertical axis in the graph in FIG. 16(c) is retaken by the square of $z/z_0$. The α to δ in the figure indicates the same lane or the same portion in the lane as in FIG. 16(c). From this graph, it is suggested that the dynamics of the penetration of the water at least into the flow path in the left side lane and the flow path in the right side lane can be represented by the square root of the time t. In addition, the central portion 8 in the flow path in the central lane is divided into two regions of the initial and latter stages as shown by the vertical broken line in FIG. 16(d). The solid line and the thin line are respectively the fitting lines in the initial and latter stages. Although intermittent in the boundary portion 9, the dynamics of the water in the initial stage is nearly the square root of the time t, and slightly faster than that in the right side lane. The dynamics of the water in the latter stage starts when the liquid front end in the outermost portion 7 in the central lane reaches the upper end of the pattern as indicated by the above vertical broken line.

FIGS. 16(e) and 16(f) are graphs showing the relation between the time t and the square of the ascending height $z/z_0$ of the water when the value of the blade space L (µm) in the central portion 8 is changed in FIG. 16(d). In FIG. 16(d), the parameters of the flow path in the central portion 8 are respectively (l, L, W)=(20, 20, 50). In FIG. 16(e), the parameters of the flow path in the central portion 8 are respectively (l, L, W)=(20, 10, 50). In addition, in FIG. 16(f), the parameters of the flow path in the central portion 8 are respectively (l, L, W)=(20, 40, 50). It should be noted that, in any of FIGS. 16(e) and 16(f), the parameters of the flow path in the outermost portion 7 were fixed to (l, L, W)=(10, 10, 25). Also in FIGS. 16(e) and 16(f), the characteristics of the dynamics of the water seen in FIG. 16(d) were confirmed.

Thus, in the combined-blade-type flow path device 1 including the boundary portion 9 where the first blades 3a with a short length were arranged in the outermost portion 7 of the combined-blade-type flow path device 1, the second blades 3b with a length longer than the first blades 3a were arranged in the central portion 8, and the first blades 3a with a short length were arranged also in the central portion 8 at regular intervals, it was confirmed that the transport speed of the fluid 4 was synergistically improved by the increase in the transport speed of the fluid 4 in the outermost portion 7 and the increase in the transport speed of the fluid 4 in the central portion 8 due to the fluid 4 previously transported to the outermost portion 7 pulling up the fluid 4 in the central portion 8.

Figure 17:
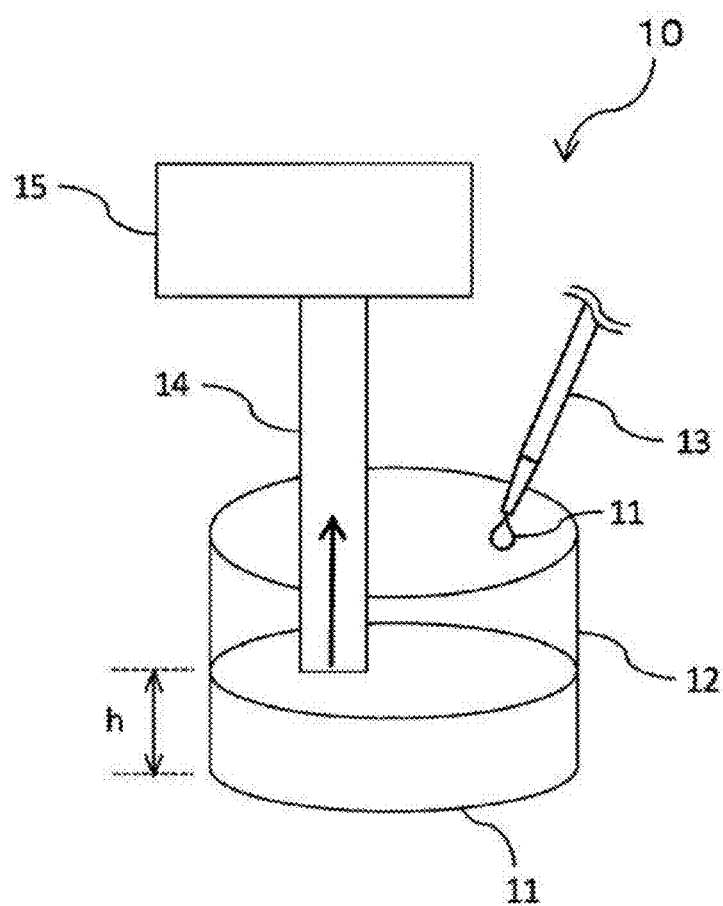
FIG. 17 is a schematic diagram showing a configuration of a fluid circulation system being an application example of the combined-blade-type open flow path device of the present invention.

As an application example of the combined-blade-type open flow path device of the present invention, a fluid circulation system was produced by using the micro flow-path device including the arrangement of $\lambda$=1 used in the test example 4. FIG. 17 is a schematic diagram showing a configuration of the fluid circulation system.

More specifically, in the fluid circulation system 10 shown in FIG. 17, a predetermined amount of the water 11 is fed into the container 12 (capacity 2 mL) containing the water (fluid) 11 of a constant amount (1 mL) by a dropping means 13 such as a pipette at regular intervals. When the water level h of the water 11 in the container 12 reaches the predetermined value (for example, the water level at which the amount of the water in the container 12 reaches 1.5 ml), the micro flow-path device 14 is inserted from the opening of the container 12 toward the liquid surface of the water 11 to be placed so that one end of the flow path (not shown) formed in the micro flow-path device 14 comes into contact with the liquid surface. In addition, the other end of the flow path of the micro flow-path device 14 communicates with the evaporation acceleration portion 15.

In the fluid circulation system 10 including this configuration, the water level h of the water 11 in the container 12 ascends due to the supply of the water 11 by the dropping means 13, and when the liquid surface of the water 11 comes into contact with one end of the flow path of the micro flow-path device 14, as indicated by the arrow in FIG. 17, the water 11 is transported to the other end through the flow path to be sent to the evaporation acceleration portion 15 provided on the other end. When the transport amount per unit time of the water 11 by the micro flow-path device 14 exceeds the supply amount per unit time of the water 11 by the dropping means 13, the water level h of the water 11 in the container 12 is lowered, the contact between the one end of the flow path and the liquid surface of the water 11 is eliminated, and the transport of the water 11 is stopped. Then, the water level h of the water 11 in the container 12 ascends again by the supply of the water 11 from the dropping means 13, the one end of the flow path and the liquid surface of the water 11 come into contact with each other, the above-mentioned transport of the water 11 is performed, and from that point on, similar behaviors are repeated.

Figure 18:
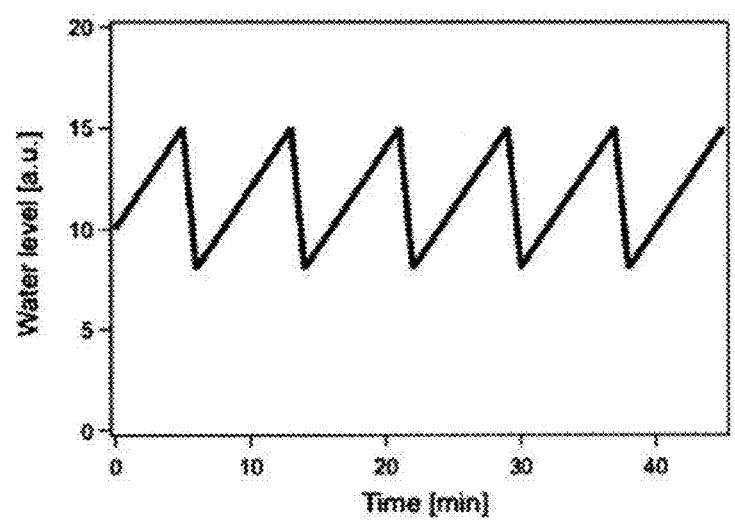
FIG. 18 is a graph showing the relation between the supply time of the water by the dropping means and the water level in the container in the fluid circulation system in FIG. 17.

FIG. 18 is a graph showing the relation between the supply time of the water 11 by the dropping means 13 and the water level h of the water 11 in the container 12 in the fluid circulation system 10 shown in FIG. 17. As understood from FIG. 18, by using the combined-blade-type open flow path device of the present invention, a fluid circulation system capable of keeping the height of the liquid level of the fluid in the container constant while sending out a fixed amount of the fluid in the container to the outside of the container at fixed time intervals can be constructed. when the flow path device with a micro structure is used, for example, a small amount fluid circulation system capable of controlling on the order of mL or µL can be constructed. This small-amount fluid circulation system is, for example, suitable for use of the automatic control system and the like of the culture solution of the cell culture in a multi-well culture well.

It should be noted that, as a comparative example, the trace-solution circulation system was produced, and the circulation test of the water was performed in the same manner as described above except for the use of micro capillary ($\varphi$0.5 mm) instead of the micro flow-path device. In this comparative example, at the time of the first contact between the liquid level of the water and one end of the micro-capillary, the water was sucked up by the micro-capillary, and was transported to the evaporation acceleration portion provided on the other end of the micro-capillary. However, at the time of the second contact (the time of contact with the liquid), air bubbles intruded inside the micro-capillary, the clogging occurred in the flow path of the micro-capillary, and therefore the water could not be transported.

Although in the above, embodiments of the present invention are described in detail, the specific embodiments of the combined-blade-type open flow path device and the combined-blade-type of the open flow path device joined body of the present invention are not at all intended to be limited to the embodiments described above, and the change and the like of design without departing from the scope of the present invention are included in the present invention. For example, as described above, as long as the arrangement structure of the blade can maintain the flow path (space) bringing about the main driving force acting on the fluid, the combined-blade-type open flow path device and the combined-blade-type open flow path device joined body of the present invention can also be set as a closed system by the glass and the like being brought into close contact with the whole or part of the flow path.

REFERENCE SIGNS LIST 1 combined-blade-type open flow path device
2 substrate
3 blade
3a first blade
3b second blade
4 fluid
5 space
6, 6a, and 6b flow path
7 outermost portion
8 central portion
9 boundary portion
10 fluid circulation system
11 water (fluid)
12 container
13 dropping means
14 micro flow-path device
15 evaporation acceleration portion

The invention claimed is:

1. A combined-blade open flow path device which is a fluid flow path device where multiple flow paths are adjacent to each other, the combined-blade open flow path device comprising:
a substrate configured to constitute a bottom portion of the flow paths; and
a plurality of blades erected on a surface of the substrate, the plurality of blades being configured to constitute side walls of the flow paths,
wherein:
the blades are erected in a plurality of groups, each of the groups extending from an upstream side to a downstream side in a flow direction of a fluid with a space between each of the blades in the flow direction of the fluid in each of the groups for making conduction of the fluid between the adjacent flow paths possible,
one end of one of the flow paths is configured to be in contact with the fluid and is configured to make a flow of the fluid possible,
the blades include first blades and second blades,
each of the first blades has a first length in the flow direction of the fluid,
each of the second blades has a second length in the flow direction of the fluid,
the second length is longer than the first length,
the first blades are in an outermost portion of the flow paths,
the second blades are in a central portion surrounded by the first blades.

2. The combined-blade open flow path device according to claim 1, wherein the combined-blade open flow path device is configured to direct the flow of the fluid in a horizontal direction where a gravity force is not involved, or in a direction against the gravity force.

3. The combined-blade open flow path device according to claim 1, wherein the space between each of the blades in the flow direction of the fluid in each of the groups is within a range from 0.1 μm to 100 μm in a micro flow-path device.

4. The combined-blade open flow path device according to claim 1, further comprising a boundary portion where the first blades are positioned in the central portion at regular intervals.

5. The combined-blade open flow path device according to claim 1, wherein each of the first length and the second length is within a range from 10 μm to 100 μm in a micro flow-path device.

6. The combined-blade open flow path device according to claim 1, wherein a forming method of the plurality of blades includes photolithography.

7. The combined-blade open flow path device according to claim 1, wherein hydrophilic or hydrophobic treatment is performed on the surface of the substrate and the blades.

8. A combined-blade open flow path device joined body comprising:
the combined-blade open flow path device according to claim 1 which is one of a plurality of unit blocks joined together.

9. The combined-blade open flow path device according to claim 1, wherein the first blades are spaced apart from an outer perimeter of the outermost portion.

* * * * *